United States Patent
Noda

(10) Patent No.: US 7,835,196 B2
(45) Date of Patent: Nov. 16, 2010

(54) NONVOLATILE MEMORY DEVICE STORING DATA BASED ON CHANGE IN TRANSISTOR CHARACTERISTICS

(75) Inventor: Kenji Noda, Fukuoka (JP)

(73) Assignee: Nscore Inc., Fukuoka-Shi, Fukuoka (JP)

( * ) Notice: Subject to any disclaimer, the term of this patent is extended or adjusted under 35 U.S.C. 154(b) by 402 days.

(21) Appl. No.: 12/088,971

(22) PCT Filed: Oct. 3, 2005

(86) PCT No.: PCT/JP2005/018600

§ 371 (c)(1),
(2), (4) Date: Apr. 2, 2008

(87) PCT Pub. No.: WO2007/043157

PCT Pub. Date: Apr. 19, 2007

(65) Prior Publication Data

US 2009/0154248 A1    Jun. 18, 2009

(51) Int. Cl.
*G11C 7/10* (2006.01)
(52) U.S. Cl. .............. 365/189.05; 365/185.12; 365/185.22
(58) Field of Classification Search ............ 365/185.18, 365/189.05, 184, 222, 154, 189.02, 194, 365/201, 207, 208
See application file for complete search history.

(56) References Cited

U.S. PATENT DOCUMENTS

| | | | |
|---|---|---|---|
| 3,636,530 A | 1/1972 | Mark et al. | |
| 4,419,744 A | 12/1983 | Rutter | |
| 5,703,820 A | 12/1997 | Kohno | |
| 5,757,696 A | 5/1998 | Matsuo et al. | |
| 5,956,269 A | 9/1999 | Ouyang et al. | |
| 6,038,168 A | 3/2000 | Allen et al. | |
| 6,064,590 A | 5/2000 | Han et al. | |
| 6,740,927 B1 | 5/2004 | Jeng | |
| 6,762,961 B2 * | 7/2004 | Eleyan et al. | ............ 365/194 |
| 6,906,953 B2 | 6/2005 | Forbes | |
| 6,906,962 B2 | 6/2005 | Layman et al. | |
| 6,909,635 B2 | 6/2005 | Forbes et al. | |
| 7,227,234 B2 | 6/2007 | Roizin et al. | |
| 2003/0190771 A1 | 10/2003 | Hyun Choi | |
| 2004/0114433 A1 | 6/2004 | Forbes | |
| 2004/0156224 A1 | 8/2004 | Buer et al. | |
| 2004/0232477 A1 | 11/2004 | Iwata et al. | |
| 2004/0252554 A1 | 12/2004 | Fournel et al. | |
| 2005/0213371 A1 | 9/2005 | Kimura | |
| 2009/0190413 A1 * | 7/2009 | Hsu et al. | ............ 365/189.09 |

FOREIGN PATENT DOCUMENTS

| | | |
|---|---|---|
| JP | 06-076582 | 3/1994 |
| JP | 06-231587 | 8/1994 |
| JP | 2001-156188 | 6/2001 |
| JP | 2002-237540 | 8/2002 |
| WO | 2004/057621 | 7/2004 |
| WO | 2006/093629 | 9/2006 |

* cited by examiner

OTHER PUBLICATIONS

International Search Report; PCT/JP2005/018600.

*Primary Examiner*—Dang T Nguyen
(74) *Attorney, Agent, or Firm*—Ladas & Parry LLP

(57) ABSTRACT

A nonvolatile memory device includes a pair of PMOS transistors, and a control circuit configured to operate in a store mode to apply to a first one of the PMOS transistors potentials that cause an NBTI degradation purposefully and to apply to a second one of the PMOS transistors potentials that cause no NBTI degradation while causing no current to flow between a source node and a drain node of the first one of the PMOS transistors, and to operate in a recall mode to set gate nodes of the PMOS transistors to a common potential to detect a difference in the NBTI degradation between said PMOS transistors.

17 Claims, 35 Drawing Sheets

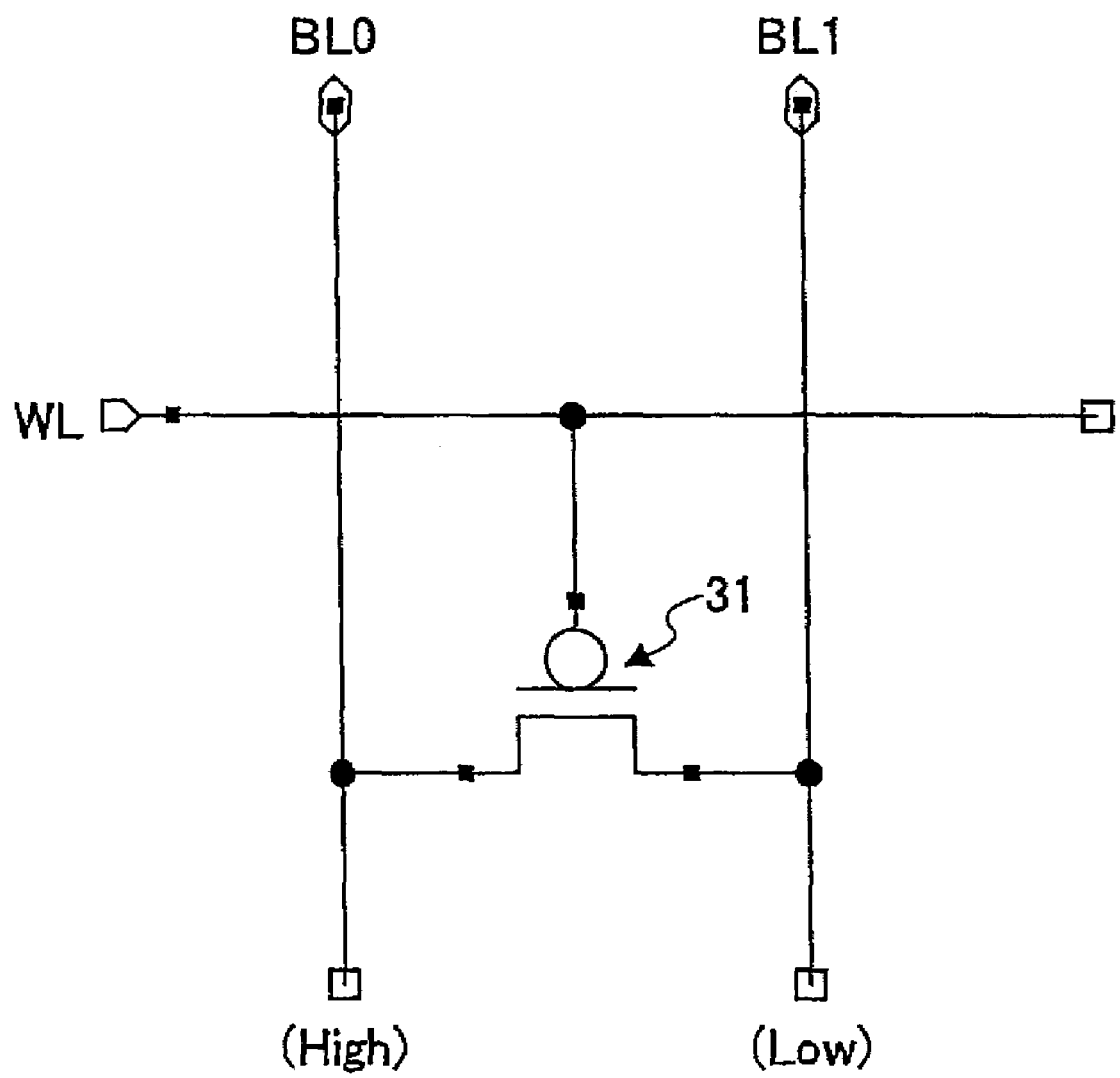

FIG.14

|  | RESTORE | RECALL | WLW | EQ | WL | WE |
|---|---|---|---|---|---|---|
| WRITE | 0 | 1 | 1 | 0 | 1 | 1 |
| READ | 0 | 1 | 1 | 0 | 1 | 0 |
| STORE | 0 | 1 | 0 | 0 | 0 | 0 |
| RECALL | 1-1-0 | 0 | 1-0-1 | 1-0-0 | 0 | 0 |
| STANDBY | 0 | 1 | 1 | 0 | 0 | 0 |

FIG.18

| | RESTORE | WLW | EQ | WL | WE |
|---|---|---|---|---|---|
| WRITE | 0 | 1 | 0 | 1 | 1 |
| READ | 0 | 1 | 0 | 1 | 0 |
| STORE | 1 | 0 | 0 | 0 | 0 |
| RECALL | 1-1-0 | 1-0-1 | 1-0-0 | 0 | 0 |
| STANDBY | 0 | 1 | 0 | 0 | 0 |

FIG.22

| | RESTORE (Vdd/GND) | RECALL (Vdd/GND) | WLW (Vpp/GND) | EQ (Vdd/GND) | WL (Vdd/GND) | WE |
|---|---|---|---|---|---|---|
| WRITE | 0 | 1 | 1 | 0 | 1 | 1 |
| READ | 0 | 1 | 1 | 0 | 1 | 0 |
| STORE | 1 | 1 | 0 | 0 | 0 | 0 |
| RECALL | 1-1-0 | 1 | 1-0-1 | 1-0-0 | 0 | 0 |
| STANDBY | 0 | 1 | 1 | 0 | 0 | 0 |

FIG.26

| | RESTORE | RECALL | WLW | EQ | WL | WE |
|---|---|---|---|---|---|---|
| WRITE | 1 | 0 | 1 | 1 | 1 | 1 |
| READ | 1 | 0 | 1 | 1 | 1 | 0 |
| STORE | 1 | 0 | 0 | 1 | 0 | 0 |
| RECALL | 0-0-1 | 1 | 1-0-1 | 0-1-1 | 0 | 0 |
| STANDBY | 1 | 0 | 1 | 1 | 0 | 0 |

FIG.30

|  | RESTORE | RECALL | WLW | EQ | WL | PLATE | WE |
|---|---|---|---|---|---|---|---|
| WRITE | 1 | 0 | 1 | 1 | 1 | Vdd | 1 |
| READ | 1 | 0 | 1 | 1 | 1 | Vdd | 0 |
| STORE | 1 | 0 | 0 | 1 | 0 | Vpp | 0 |
| RECALL | 0-0-1 | 1 | 1-0-1 | 0-1-1 | 0 | Vdd | 0 |
| STANDBY | 1 | 0 | 1 | 1 | 0 | Vdd | 0 |

FIG.35

| | RESTORE | RECALL | WLW | EQ | WL | WE |
|---|---|---|---|---|---|---|
| WRITE | 1 | 0 | 0 | 1 | 1 | 1 |
| READ | 1 | 0 | 0 | 1 | 1 | 0 |
| STORE | 1 | 0 | 1 | 1 | 0 | 0 |
| RECALL | 0-0-1 | 1 | 0-1-0 | 0-1-1 | 0 | 0 |
| STANDBY | 1 | 0 | 0 | 1 | 0 | 0 |

# NONVOLATILE MEMORY DEVICE STORING DATA BASED ON CHANGE IN TRANSISTOR CHARACTERISTICS

TECHNICAL FIELD

The present invention generally relates to a memory device, and particularly relates to a nonvolatile memory device which is capable of retaining stored data in the absence of a power supply voltage.

BACKGROUND ART

Nonvolatile semiconductor memory devices, which can retain stored data even when power is turned off, include flash EEPROMs employing a floating gate structure, FeRAMs employing a ferroelectric film, MRAMs employing a ferromagnetic film, etc.

In the case of EEPROMs, there is a need to manufacture a transistor having a special structure comprised of a floating gate. In the case of FeRAMs and MRAMs, which achieve nonvolatile storage by use of a ferroelectric material and a ferromagnetic material, respectively, there is a need to form and process a film made of these respective materials. The need for such transistor having a special structure and the need for such film made of a special material are one of the factors that result in an increase in the manufacturing costs.

PCT/JP2003/014143, which was filed on Dec. 17, 2003, the entire contents of which are hereby incorporated by reference, discloses a memory cell (i.e., a basic unit of data storage) comprised of a pair of transistors which are configured to experience a hot-carrier effect on purpose for storage of one-bit data. A difference in the transistor characteristics caused by the hot-carrier effect represents one-bit data "0" or "1".

Specifically, when one of the two transistors is subjected to a hot-carrier effect, a difference in the ON current develops between the two transistors. The difference in the ON current may be detected by a one-bit static memory circuit (latch) coupled to the transistor pair.

The hot-carrier effect is created by high-energy electrons that are generated when an electric current runs through a MOS transistor between the source node and the drain node. It thus follows that the current continuously flows through the MOS transistor at the time of write operation. In order to reduce the time required for write operation effectively, it is preferable to perform write operations with respect to a plurality of bits simultaneously. As long as the hot carrier effect is used as a basis of write operation, however, the number of bits that can be written simultaneously is limited such that a total of the currents flowing through MOS transistors at the time of write operation does not exceed the capacity of power supply.

Accordingly, there is a need for a nonvolatile memory device that can store data based on a change in the transistor characteristics caused by a phenomenon that does not require the flow of an electric current between a source node and a drain node at the time of write operation.

DISCLOSURE OF INVENTION

It is a general object of the present invention to provide a nonvolatile memory device that substantially obviates one or more problems caused by the limitations and disadvantages of the related art.

It is another and more specific object of the present invention to provide a nonvolatile memory device that can store data based on a change in the transistor characteristics caused by a phenomenon that does not require the flow of an electric current between a source node and a drain node at the time of write operation.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile memory circuit and nonvolatile memory device particularly pointed out in the specification in such full, clear, concise, and exact terms as to enable a person having ordinary skill in the art to practice the invention.

To achieve these and other advantages in accordance with the purpose of the invention, the invention provides a nonvolatile memory device, which includes a pair of PMOS transistors, and a control circuit configured to operate in a store mode to apply to a first one of the PMOS transistors potentials that cause an NBTI degradation purposefully and to apply to a second one of the PMOS transistors potentials that cause no NBTI degradation while causing no current to flow between a source node and a drain node of the first one of the PMOS transistors, and to operate in a recall mode to set gate nodes of the PMOS transistors to a common potential to detect a difference in the NBTI degradation between the PMOS transistors.

According to another aspect of the present invention, a nonvolatile memory device includes a pair of NMOS transistors, and a control circuit configured to operate in a store mode to apply to a first one of the NMOS transistors potentials that cause an PBTI degradation purposefully and to apply to a second one of the NMOS transistors potentials that cause no PBTI degradation while causing no current to flow between a source node and a drain node of the first one of the NMOS transistors, and to operate in a recall mode to set gate nodes of the NMOS transistors to a common potential to detect a difference in the PBTI degradation between the NMOS transistors.

According to another aspect of the present invention, a nonvolatile memory device includes a plurality of word lines, a plurality of bit line pairs, a memory cell array including a plurality of memory cells arranged in a matrix, one of the memory cells coupled to one of the bit line pairs that includes a first bit line and a second bit line, the one of the memory cells including a latch having a first node and a second node configured such that a potential of the first node is inverse to a potential of the second node, a first PMOS transistor having one of source/drain nodes thereof coupled to the first node of the latch, a second PMOS transistor having one of source/drain nodes thereof coupled to the second node of the latch, a third transistor having a gate thereof coupled to one of the word lines and source/drain nodes thereof coupled to the first node and the first bit line, respectively, a fourth transistor having a gate thereof coupled to the one of the word lines and source/drain nodes thereof coupled to the second node and the second bit line, respectively, and a control circuit configured to operate in a store mode to apply to, the first PMOS transistor, potentials that cause an NBTI degradation purposefully, and to apply to, the second PMOS transistor, potentials that cause no NBTI degradation while causing no current to flow between a source node and a drain node of the first PMOS transistor, and to operate in a recall mode to set gate nodes of the first and second PMOS transistors to a common potential such as to cause the latch to detect a difference in the NBTI degradation between the first PMOS transistor and the second PMOS transistor.

According to another aspect of the present invention, a method of writing and reading data to and from a memory circuit includes applying, to a PMOS transistor, potentials that cause a NBTI degradation, and detecting the NBTI degradation as data stored in the PMOS transistor.

According to another aspect of the present invention, a method of writing and reading data to and from a memory circuit, comprising applying, to a NMOS transistor, potentials that cause a PBTI degradation, and detecting the PBTI degradation as data stored in the NMOS transistor.

Other objects and further features of the present invention will be apparent from the following detailed description when read in conjunction with the accompanying drawings.

BRIEF DESCRIPTION OF DRAWINGS

FIG. 8A is a drawing showing an example of a single-transistor memory cell.

FIG. 14 is a table chart showing the signal levels of the control signals that are defined with respect to each operation.

FIG. 18 is a table chart showing the signal levels of control signals that are defined with respect to each operation.

FIG. 22 is a table chart showing the signal levels of control signals that are defined with respect to each operation.

FIG. 26 is a table chart showing the signal levels of the control signals that are defined with respect to each operation.

FIG. 30 is a table chart showing the signal levels of control signals that are defined with respect to each operation.

FIG. 35 is a table chart showing the signal levels of control signals that are defined with respect to each operation.

BEST MODE FOR CARRYING OUT THE INVENTION

In the following, embodiments of the present invention will be described with reference to the accompanying drawings.

Figure 1:
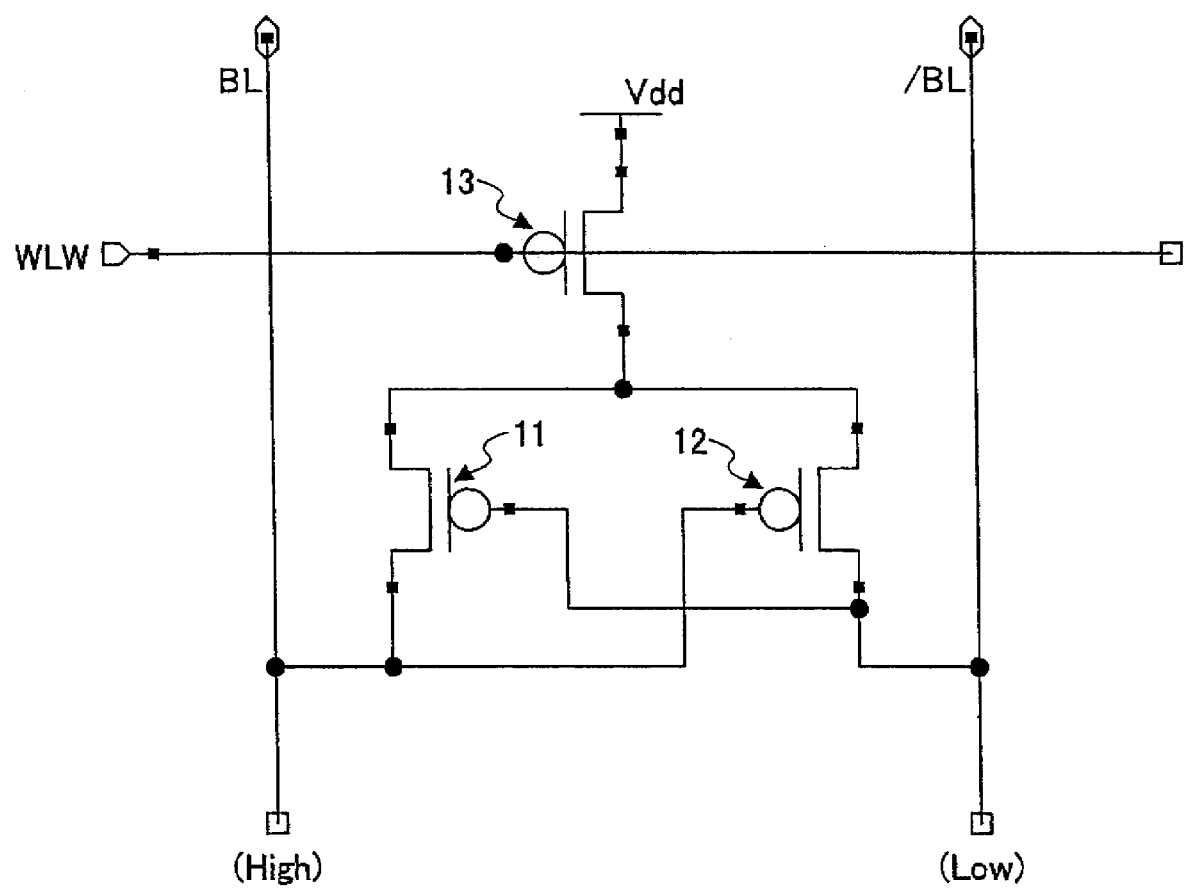
FIG. 1 is a circuit diagram showing a first embodiment of a nonvolatile memory circuit according to the present invention.

FIG. 1 is a circuit diagram showing a first embodiment of a nonvolatile memory circuit according to the present invention. In FIG. 1, the nonvolatile memory cell according to the present invention is comprised of p-channel MOS transistors as a non-limiting example. Other transistors such as n-channel silicon MOS transistors may as well be used to form the nonvolatile memory cell according to the present invention.

When p-channel MOS transistors are used, a phenomenon known as NBTI (Negative Bias Temperature Instability) is used in place of the hot-carrier effect used in the related-art memory circuit. NBTI is a phenomenon which occurs when a negative voltage is applied to the gate node of a p-type MOS transistor while the source and drain nodes are coupled to the ground potential, thereby causing degradation in transistor characteristics such as a decrease in carrier mobility or a lowering in the threshold voltage (i.e., an increase in the magnitude of threshold voltage since the threshold voltage is negative in the case of a PMOS transistor). When n-channel MOS transistors are used, a phenomenon known as PBTI (Positive Bias Temperature Instability) is used in place of the hot-carrier effect used in the related-art memory circuit. In the case of PBTI, all the potentials applied to the memory circuit are reverse to the potentials applied to an NBTI-based memory circuit.

The memory circuit of FIG. 1 includes a PMOS transistor 11, a PMOS transistor 12, a PMOS transistor 13, a word selecting line WLW, and a pair of bit lines BL and /BL. The PMOS transistor 11 has the gate node thereof coupled to the bit line /BL, the source node thereof coupled to a power supply potential Vdd through the PMOS transistor 13, and the drain node thereof coupled to the bit line BL. The PMOS transistor 12 has the gate node thereof coupled to the bit line BL, the source node thereof coupled to the power supply potential Vdd through the PMOS transistor 13, and the drain node thereof coupled to the bit line /BL. The PMOS transistor 13 has the gate node thereof coupled to the word selecting line WLW, the source node thereof coupled to the power supply potential Vdd, and the drain node thereof coupled to the source nodes of the PMOS transistors 11 and 12. This memory circuit is configured such that the potentials applied to the gate nodes of the PMOS transistors 11 and 12 serving as data storage can be controlled independently of each other.

Figure 2:
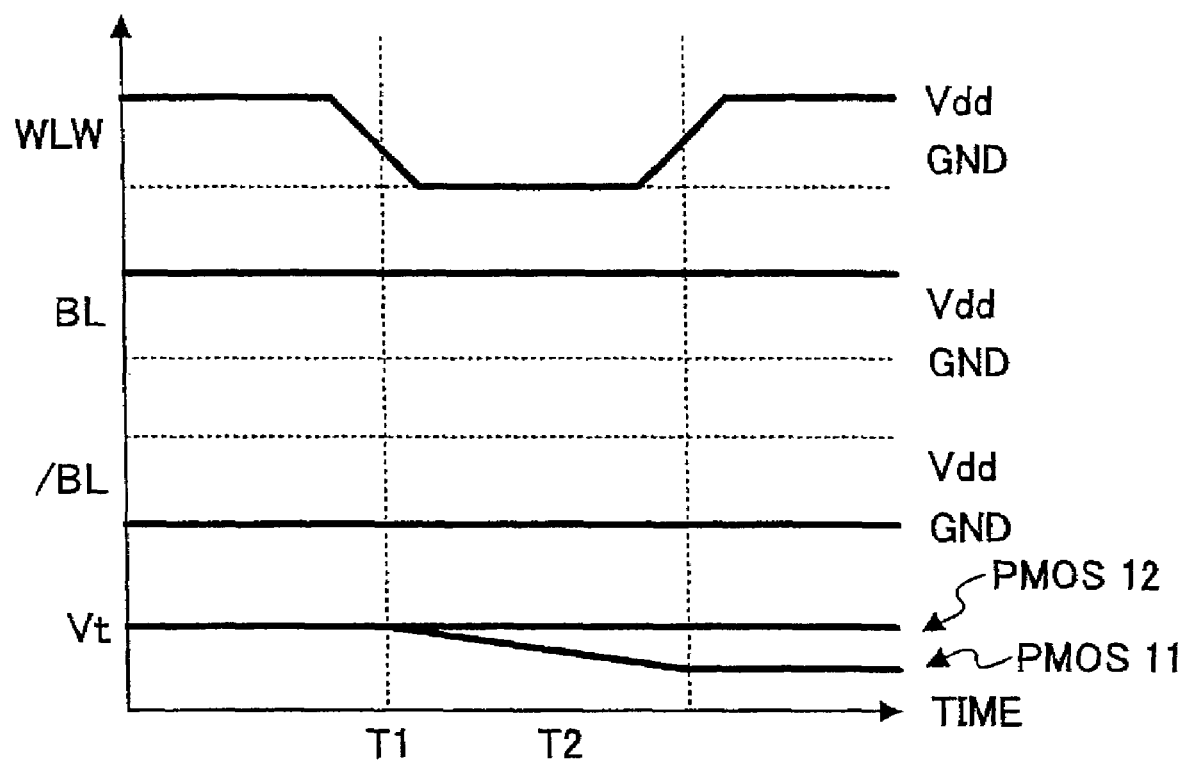
FIG. 2 is a drawing for explaining a write operation of the memory circuit shown in FIG. 1.

FIG. 2 is a drawing for explaining a write operation of the memory circuit shown in FIG. 1. In order to utilize NBTI, the source and drain nodes are set to a common potential, and the gate node is set to a potential lower than this common potential, thereby degrading the transistor characteristics without requiring a current flowing through the transistor. In the memory circuit shown in FIG. 1, the bit line BL is set to the power supply potential Vdd, and the bit line /BL is set to the ground potential GND, with the word selecting line WLW being set to the ground potential, for example, as shown in FIG. 2. The setting of the word selecting line WLW to the ground potential makes the PMOS transistor 13 conductive, thereby supplying the power supply potential Vdd to the source nodes of the PMOS transistors 11 and 12.

With this provision, the PMOS transistor 11 has the gate node thereof set to the ground potential GND while the source node and drain node are set to the power supply potential Vdd. As for the PMOS transistor 12, its gate node is set to the power supply potential Vdd. As a result, only the PMOS transistor 11 degrades through NBTI so as to have lower carrier mobility (lower threshold voltage Vt) while no current flows through either one of the transistors.

It is known that a rate of the degradation increases as the potential gap between the gate node and the source and drain nodes increases. In order to cause sufficient degradation in the transistor characteristics, it is preferable to apply a voltage higher than the normal operating voltage of the transistors.

Which one of the PMOS transistors 11 and 12 has lower carrier mobility reflects which one of the bit lines BL and /BL was HIGH at the time of the write operation. Accordingly, which one of the PMOS transistors 11 and 12 has lower carrier mobility represents data "0" or "1". A difference in carrier mobility between the PMOS transistor 11 and the PMOS transistor 12 can then be detected as data stored in the nonvolatile memory circuit of the present invention. Such detecting mechanism (sensing mechanism) will later be described.

Figure 3:
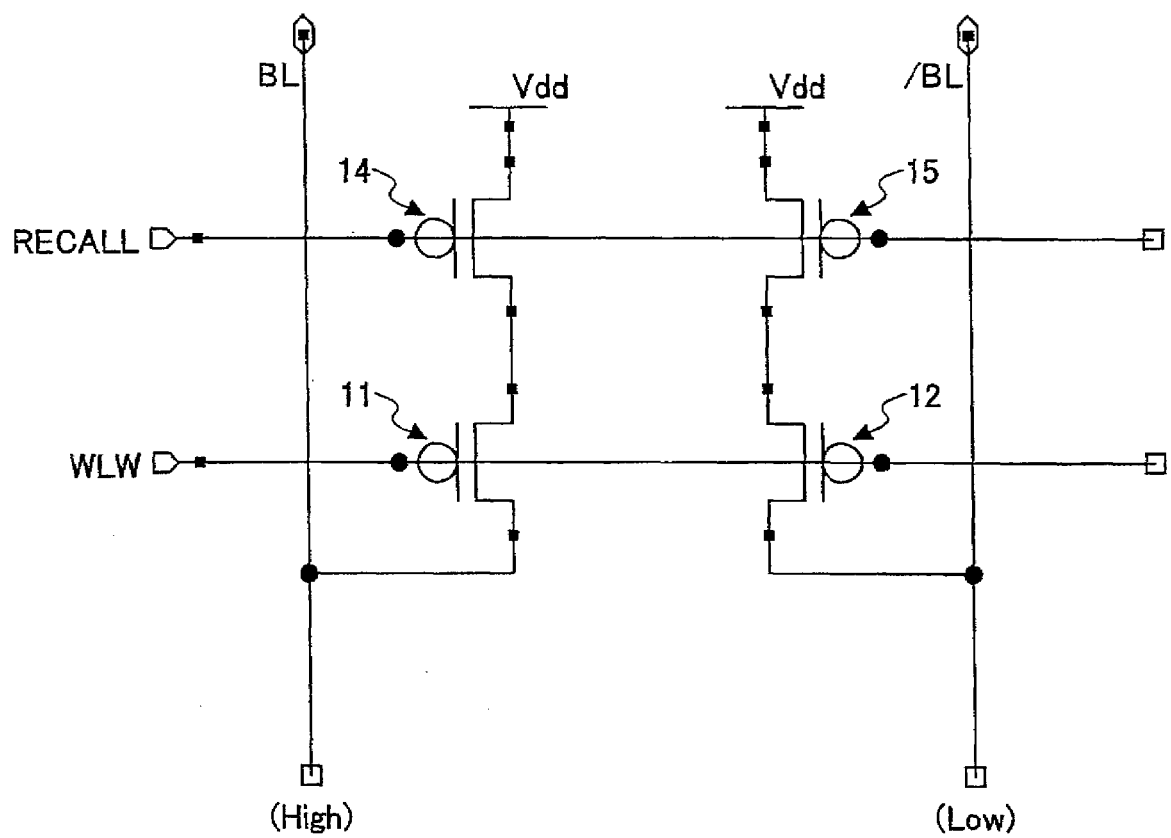
FIG. 3 is a circuit diagram showing a second embodiment of a nonvolatile memory circuit according to the present invention.

FIG. 3 is a circuit diagram showing a second embodiment of a nonvolatile memory circuit according to the present invention. As in the first embodiment, the use of p-channel MOS transistors is a non-limiting example, and other transistors such as n-channel silicon MOS transistors may as well be used to form the nonvolatile memory cell according to the present invention.

The memory circuit of FIG. 3 includes the PMOS transistor 11, the PMOS transistor 12, a PMOS transistor 14, a PMOS transistor 15, a word selecting line WLW, a recall line RECALL, and the bit lines BL and /BL. The PMOS transistor 11 has the gate node thereof coupled to the word selecting line WLW, the source node thereof coupled to the power supply potential Vdd via the PMOS transistor 14, and the drain node thereof coupled to the bit line BL. The PMOS transistor 12 has the gate node thereof coupled to the word selecting line WLW, the source node thereof coupled to the power supply potential Vdd via the PMOS transistor 15, and the drain node thereof coupled to the bit line /BL. The PMOS transistor 14 has the gate node thereof coupled to the recall line RECALL, the source node thereof coupled to the power supply potential Vdd, and the drain node thereof coupled to the source node of the PMOS transistor 11. The PMOS transistor 15 has the gate node thereof coupled to the recall line RECALL, the source node thereof coupled to the power supply potential Vdd, and the drain node thereof coupled to the source node of the PMOS transistor 12. This memory circuit is configured such that the potentials applied to the source nodes of the PMOS transistors 11 and 12 serving as data storage can be controlled independently of each other.

Figure 4:
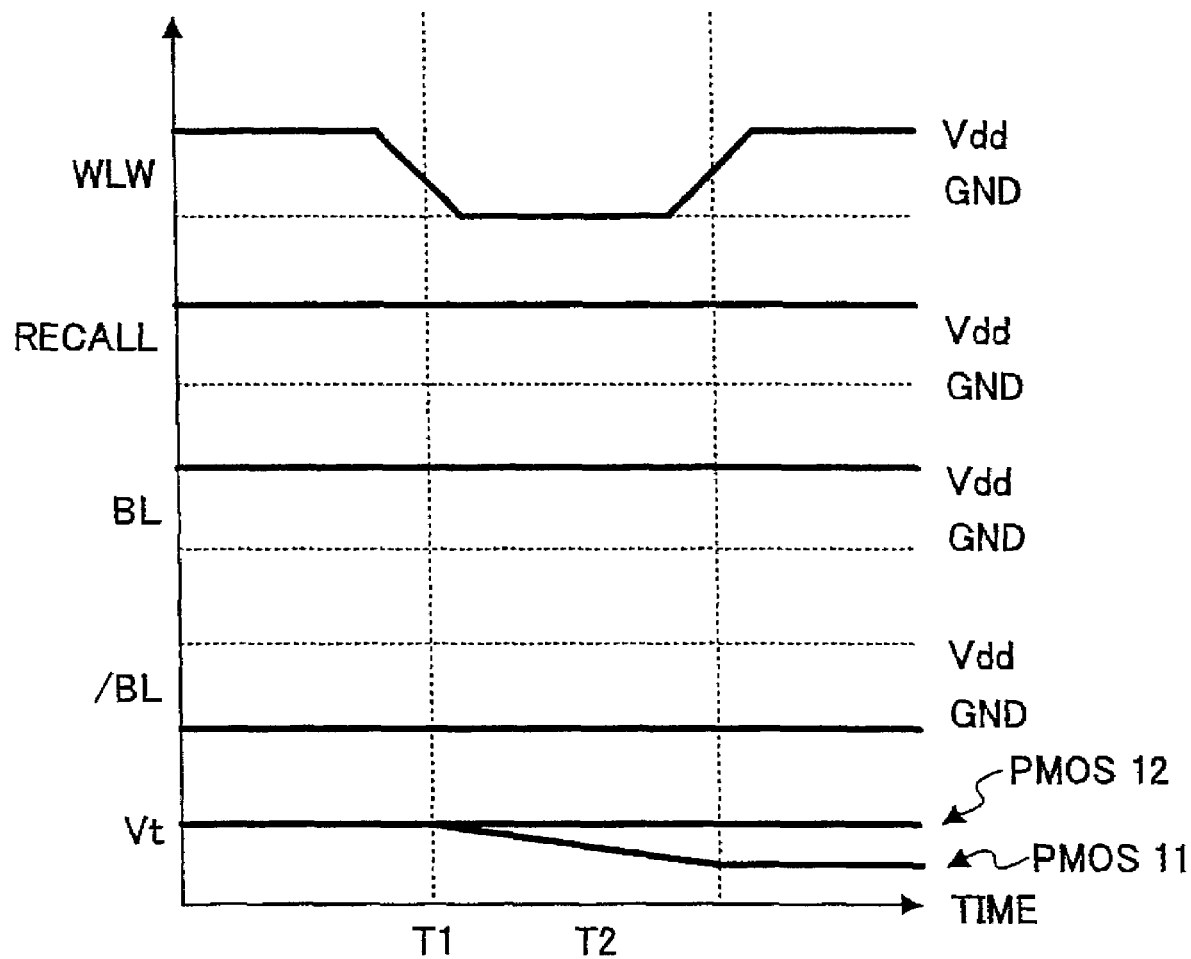
FIG. 4 is a drawing for explaining a write operation of the memory circuit shown in FIG. 3.

FIG. 4 is a drawing for explaining a write operation of the memory circuit shown in FIG. 3. In the memory circuit shown in FIG. 3, the bit line BL and the recall line RECALL are set to the power supply potential Vdd, and the bit line /BL is set to the ground potential, with the word selecting line WLW being set to the ground potential, for example, as shown in FIG. 4. The setting of the recall line RECALL to the power supply potential Vdd makes the PMOS transistors 14 and 15 nonconductive, thereby placing the source nodes of the PMOS transistors 11 and 12 in a floating state.

Since the gate node of the PMOS transistor 11 is set to the ground potential, the floating source node of the PMOS transistor 11 is electrically coupled to the drain node that is set to the power supply potential Vdd. As for the PMOS transistor 12, the gate node of the PMOS transistor 12 is set to the ground potential, but the drain node thereof is also set to the ground potential GND. As a result, only the PMOS transistor 11 degrades through NBTI while no current flows through either one of the transistors.

It should be noted that the recall line RECALL is used (set to the ground potential) when detecting a difference in carrier mobility between the PMOS transistor 11 and the PMOS transistor 12 as data stored in the nonvolatile memory circuit. Such detecting mechanism (sensing mechanism) will later be described.

Figure 5:
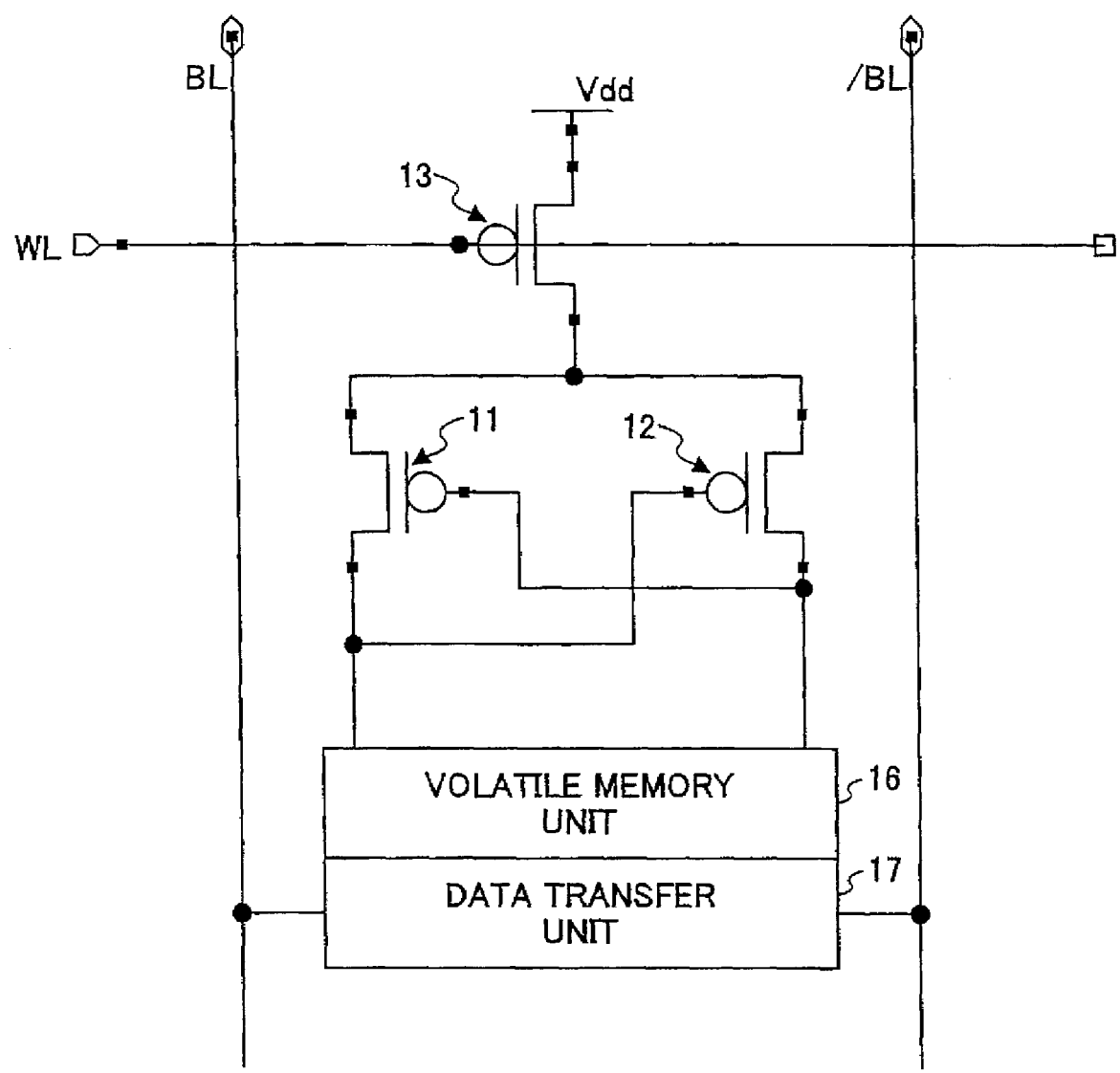
FIG. 5 is a circuit diagram showing a third embodiment of the nonvolatile memory circuit according to the present invention.

FIG. 5 is a circuit diagram showing a third embodiment of the nonvolatile memory circuit according to the present invention. In FIG. 5, a circuit portion comprised of the PMOS transistors 11, 12, and 13 operates in the same manner as that of the memory circuit shown in FIG. 1. Since data is written through NBTI and stored as a lingering change in the transistor characteristics, there is a limit to the number of writings that can be performed in the circuit of FIG. 1. In consideration of this, the memory circuit of FIG. 5 includes a volatile memory unit 16 such as an SRAM memory cell for storing one bit data and a data transfer unit 17 such as transfer-gate transistors.

A word line WL is coupled to the data transfer unit 17. When the word line WL is activated, the data transfer unit 17 establishes electrical couplings between the bit lines BL and /BL and the volatile memory unit 16. Through these electrical couplings, the data stored in the volatile memory unit 16 may be read to the bit lines BL and /BL, or the data supplied through the bit lines BL and /BL may be stored in the volatile memory unit 16.

The memory circuit as shown in FIG. 5 is configured such that data is written from the volatile memory unit 16 to the nonvolatile memory unit (i.e., PMOS transistors 11, 12, and 13) and read from the nonvolatile memory unit to the volatile memory unit 16 as such need arises. This configuration allows routine read/write operations to be performed with respect to the volatile memory unit 16. At the timing immediately prior to power-off, for example, data is written to the nonvolatile memory portion, thereby reducing the effect of the limited number of writings that can be performed with respect to the nonvolatile memory portion. Since the volatile memory unit 16 takes care of all the read/write requests while the power is on, the use of the volatile memory unit 16 that is superior in terms of read/write speed can improve the performance of the memory circuit during routine operations.

Figure 6:
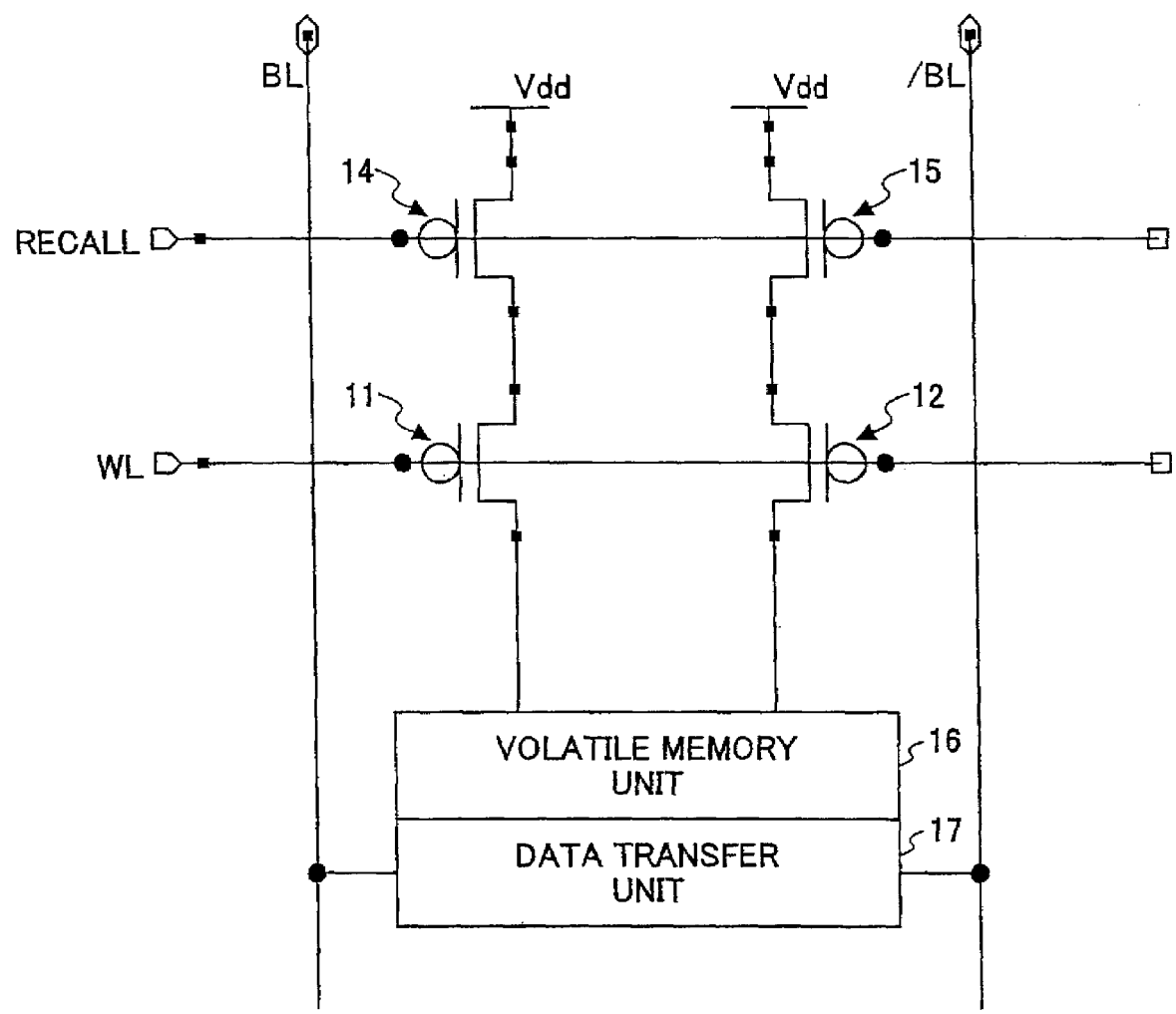
FIG. 6 is a circuit diagram showing a fourth embodiment of the nonvolatile memory circuit according to the present invention.

FIG. 6 is a circuit diagram showing a fourth embodiment of the nonvolatile memory circuit according to the present invention. FIG. 6 has a configuration substantially the same as that shown in FIG. 5, except for the circuit configuration of the nonvolatile memory unit. The nonvolatile memory unit of the circuit shown in FIG. 6 includes the PMOS transistors 11, 12, 14, and 15, and operates in the same manner as that of the memory circuit shown in FIG. 3. The nonvolatile memory circuit of FIG. 6 achieves the same advantages as the nonvolatile memory circuit of FIG. 5.

In the nonvolatile memory circuits shown in FIG. 5 and FIG. 6, it is not preferable to have transistor characteristics changed with respect to the transistors constituting the volatile memory unit 16 and the data transfer unit 17. Because of this, provision may be made such that these transistors provided in the volatile memory unit 16 and the data transfer unit 17 operate with the routine operating voltages. For example, the transistors of the volatile memory unit 16 and the data transfer unit 17 may be given a thicker gate oxide film than the PMOS transistors 11 and 12. This successfully combines satisfactory nonvolatile storage performance with sufficient operation reliability.

Figure 7A:
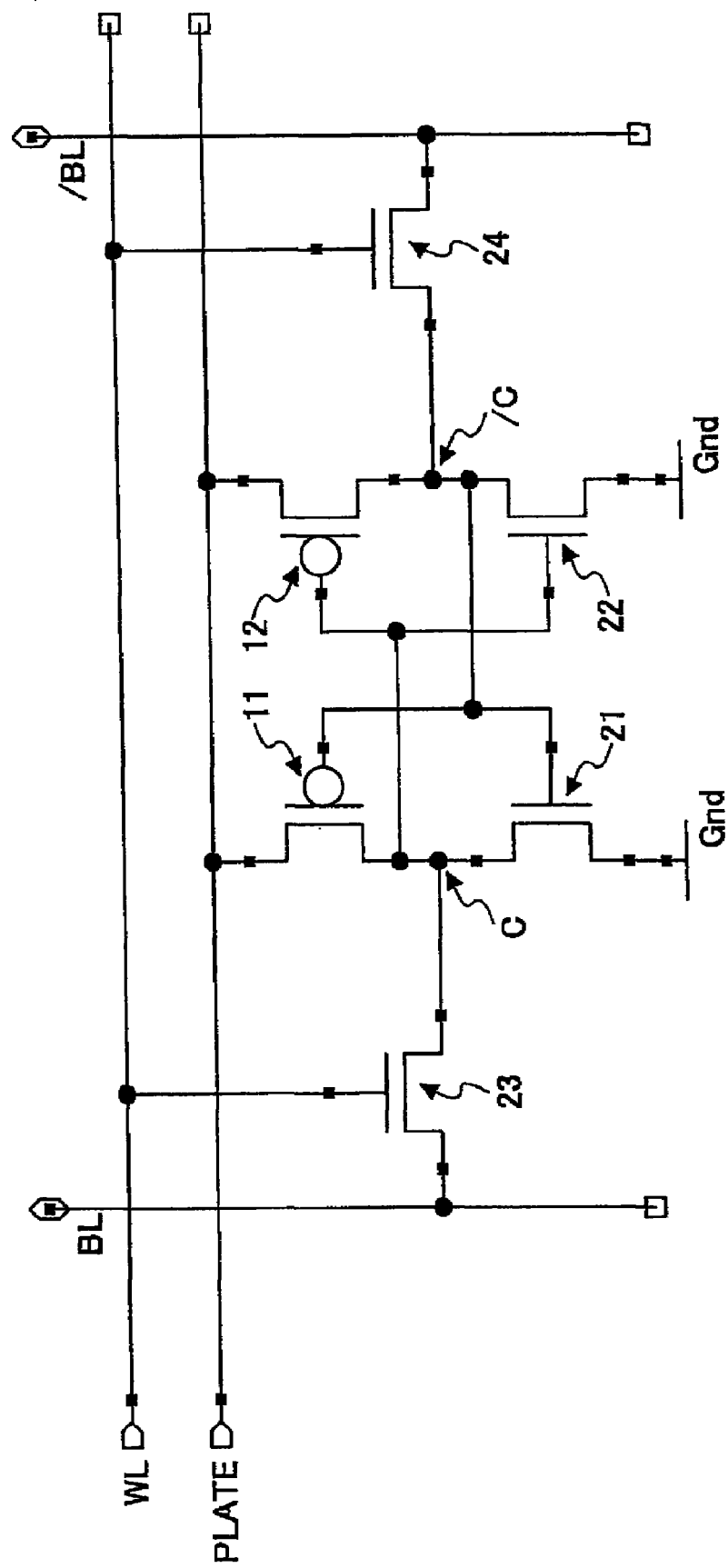
FIG. 7A is a circuit diagram showing a fifth embodiment of the nonvolatile memory circuit according to the present invention.

FIG. 7A is a circuit diagram showing a fifth embodiment of the nonvolatile memory circuit according to the present invention. The nonvolatile memory circuit of FIG. 7A includes the PMOS transistor 11, the PMOS transistor 12, NMOS transistors 21 through 24, a word line WL, and a plate line PLATE.

This circuit configuration shown in FIG. 7 is simply an SRAM cell on the surface. The present invention manipulates this SRAM cell differently from the conventional way. While desired data is stored in the SRAM cell, a potential higher than the routine operating voltage is supplied to the plate line PLATE, which causes deterioration in the transistor characteristics in the PMOS transistor 11 or the PMOS transistor 12, whichever is selected in response to the stored data.

If the bit lines BL and /BL are set to the power supply voltage and the ground voltage, respectively, an activation of the word line WL results in data being stored such that the PMOS transistors 11 and 12 are on and off, respectively. That is, nodes C and /C are set to HIGH and LOW, respectively.

Figure 7B:
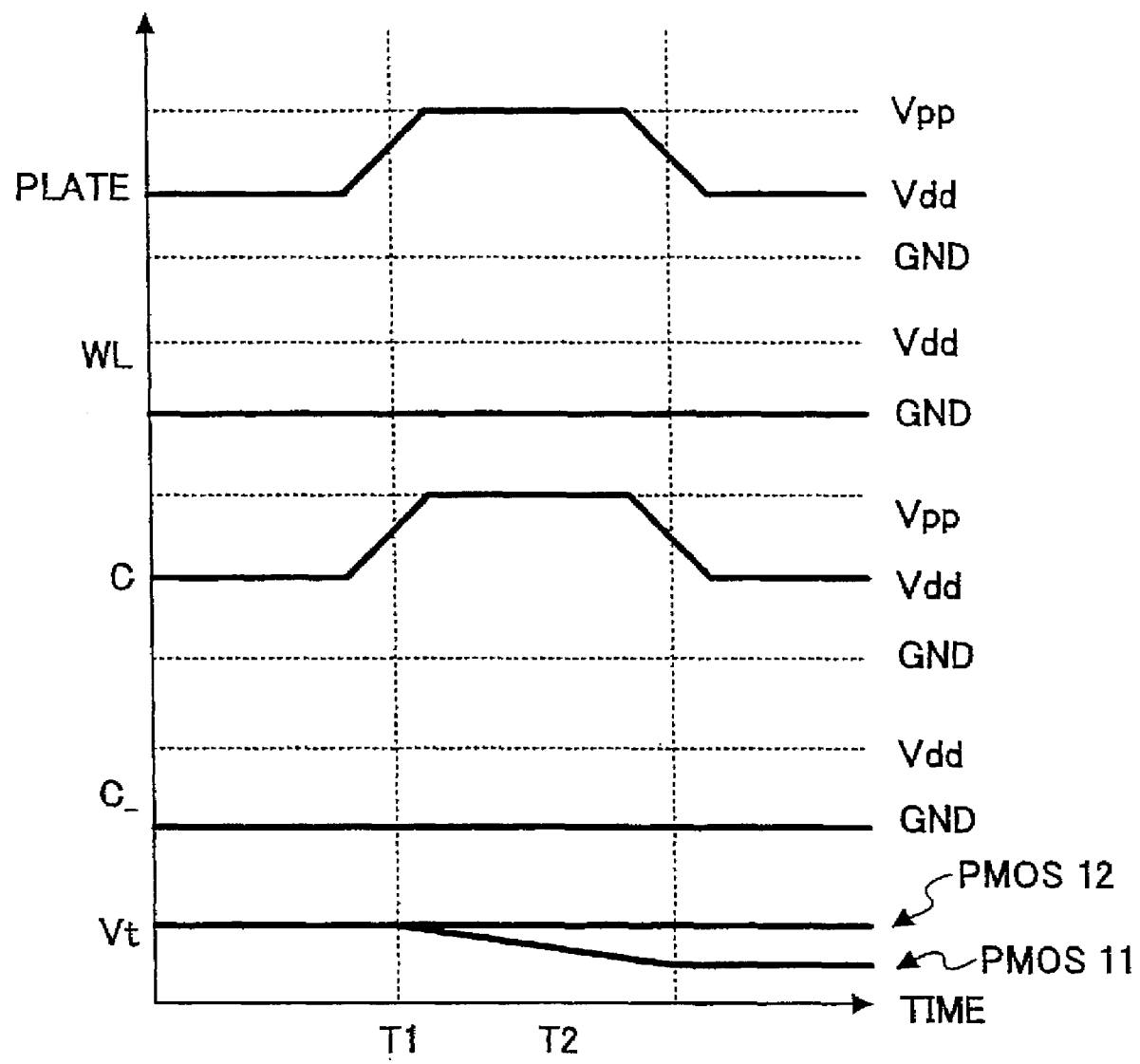
FIG. 7B is a drawing for explaining a write operation of the memory circuit shown in FIG. 7A.

After the data is stored as described above, the potential of the plate line PLATE is raised to Vpp above the normal operating voltage Vdd as shown in FIG. 7B. This causes the potential of the node C to rise to Vpp above the normal operating voltage Vdd while the node /C stays at the ground voltage GND. With this provision, only the PMOS transistor 11 deteriorates through NBTI while the PMOS transistor 12 does not deteriorate.

Power is then turned off, and subsequently turned on. The deterioration as described above creates an imbalance in the flip-flop comprised of the PMOS transistors 11 and 12 and the NMOS transistors 21 and 22, so that the PMOS transistors 11 and 12 will be off and on, respectively, when the flip-flop is fully activated.

In this configuration, the data recovered after the power off is inverse to the data originally stored. When data is to be stored in the memory cell, therefore, a data inversion circuit or the like may be used to invert the data before it is stored in the memory cell.

Figure 8B:
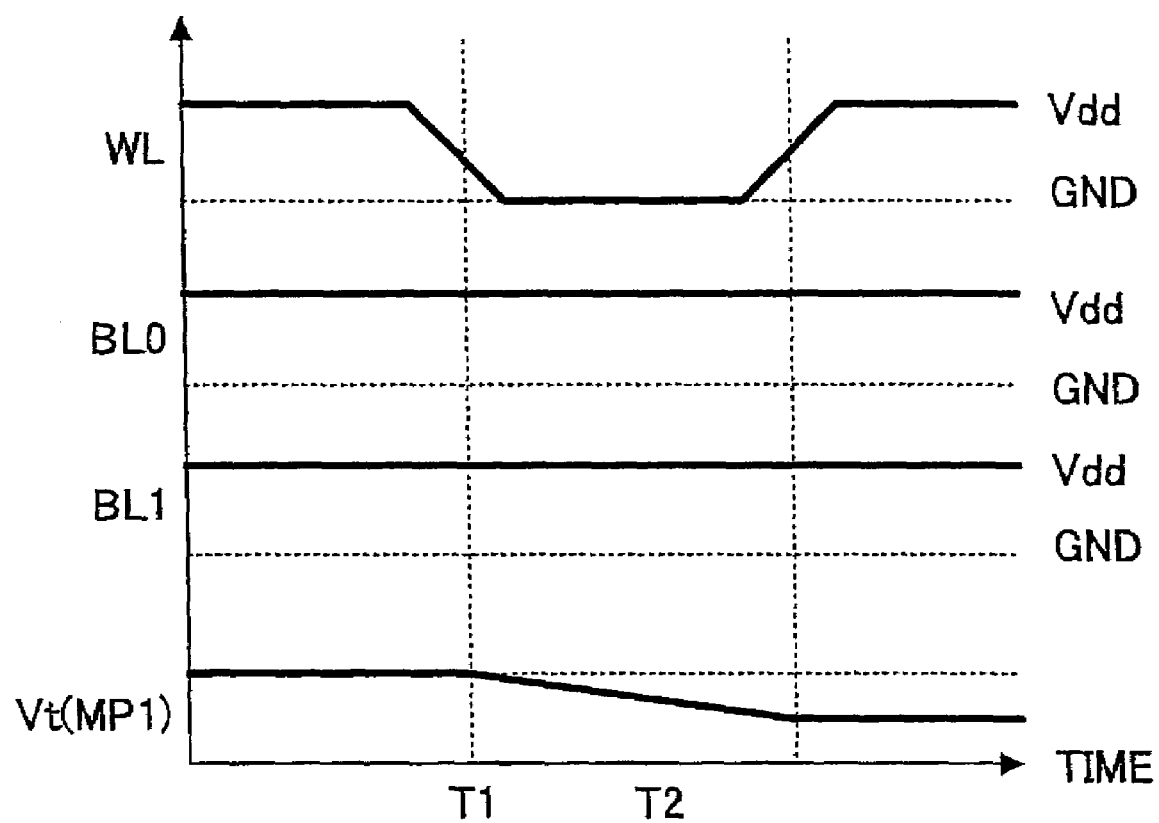
FIG. 8B is a drawing for explaining a write operation of the circuit shown in FIG. 8A.

The embodiments described above are directed to the configuration in which a pair of transistors is used as a memory cell. The present invention is not limited to such an example. By use of NBTI, data can be stored in a single transistor. FIG. 8A is a drawing showing a memory cell comprised of a single transistor. The memory cell of FIG. 8A includes a PMOS transistor 31, which has the gate node thereof coupled to a word line WL, the source node thereof coupled to a bit line BL0, and the drain node thereof coupled to a bit line BL1. As shown in FIG. 8B, the word line WL is set to the ground potential GND, and the bit lines BL0 and BL1 are set to the power supply potential Vdd, which causes the PMOS transistor 31 to experience an NBTI degradation.

Figure 9A:
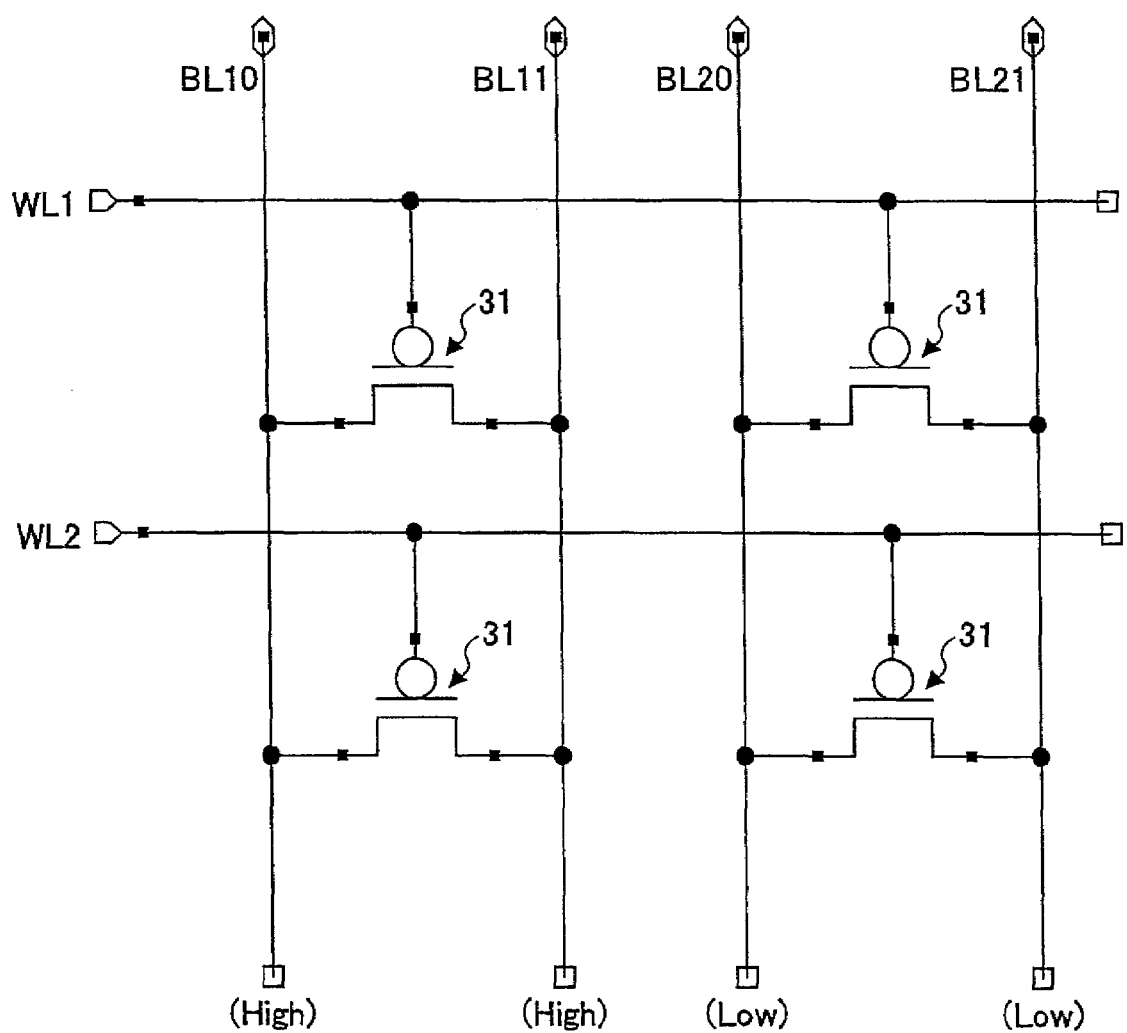
FIG. 9A is a drawing showing an example of single-transistor memory cells arranged in a matrix.

Further, the present invention is not limited to a single memory cell, but a plurality of memory cells may be arranged in a matrix. FIG. 9A is s drawing showing a plurality of memory cells arranged in matrix form. PMOS transistors 31 arranged in the same row share the same word line WL1 or WL2, and the PMOS transistors 31 arranged in the same column share the same bit lines BL10 and BL11 or BL20 and BL21.

Figure 9B:
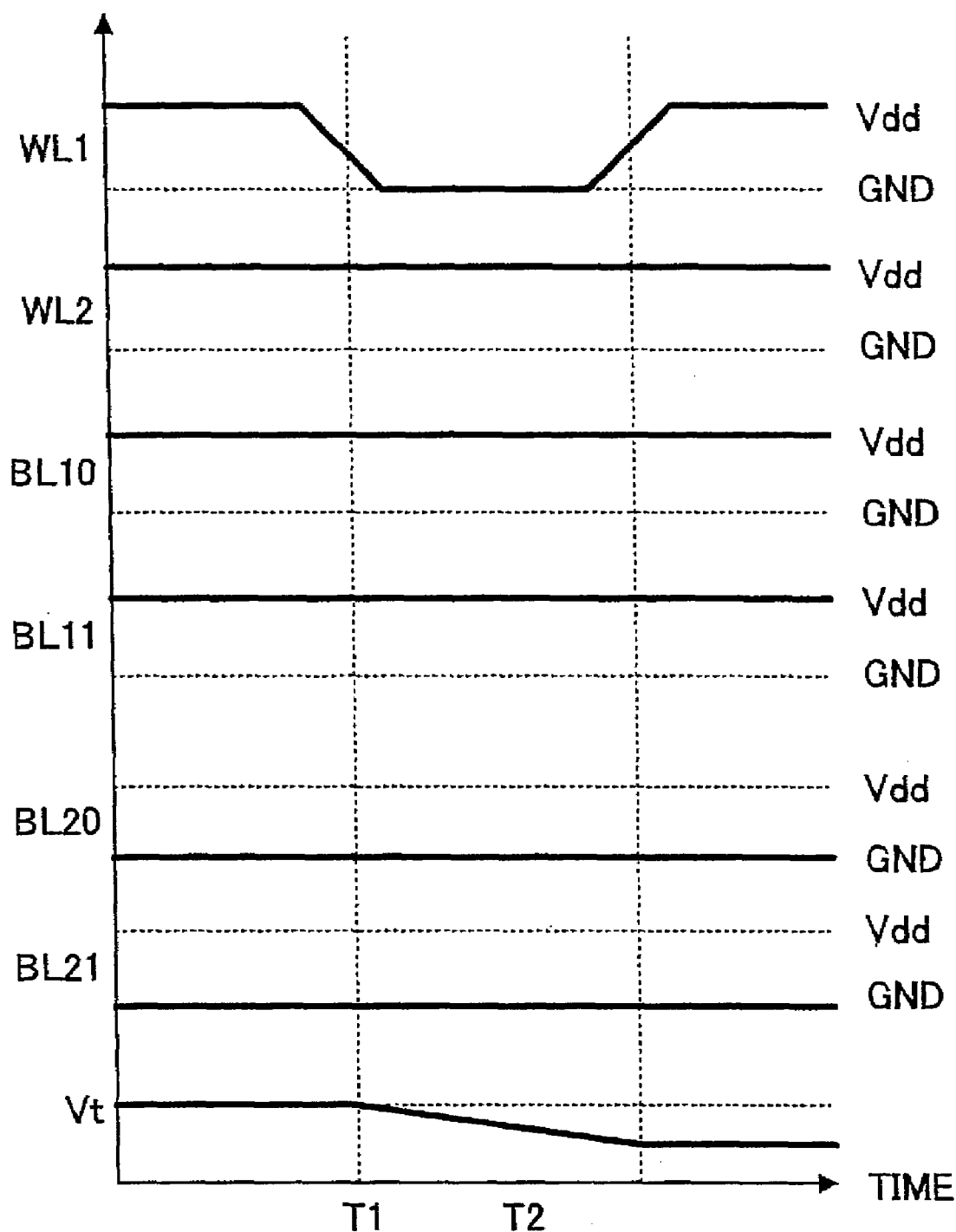
FIG. 9B is a drawing for explaining a write operation of the circuit shown in FIG. 9A.

As shown in FIG. 9B, the word line WL1 is changed to the ground potential while the word line WL2 stays at the power supply potential Vdd. Further, the bit lines BL10 and BL11 are set to the power supply potential Vdd, and the bit lines BL20 and BL21 are set to the ground potential GND. This causes only the PMOS transistor 31 coupled to the word line WL1 and the bit lines BL10 and BL11 to degrade through NBTI so as to have lower carrier mobility (lower threshold voltage Vt).

In the single-transistor memory cell configuration as shown in FIG. 8A and FIG. 9A, a circuit for sensing a change in the resistance or threshold voltage of transistors may be coupled to each bit line. Such a sense circuit may utilize a reference cell with which a memory cell storing data therein is compared.

Figure 10:
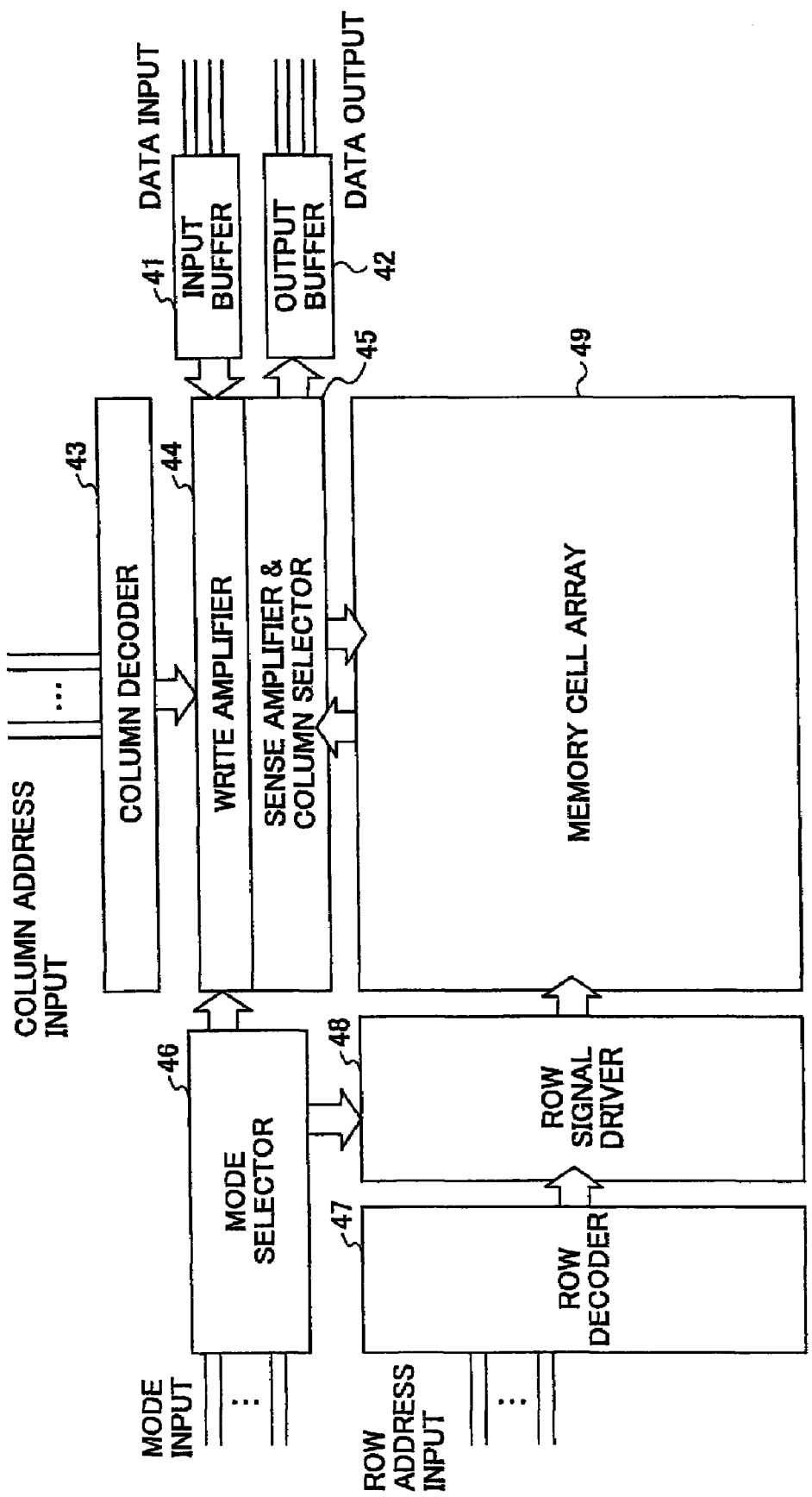
FIG. 10 is a block diagram showing the configuration of a nonvolatile semiconductor memory device according to the present invention.

FIG. 10 is a block diagram showing the configuration of a nonvolatile semiconductor memory device according to the present invention. A semiconductor memory device 40 shown in FIG. 10 includes an input buffer 41, an output buffer 42, a column decoder 43, a write amplifier 44, a sense amplifier & column selector 45, a mode selector 46, a row decoder 47, a row signal driver 48, and a memory cell array 49.

The memory cell array 49 includes a plurality of memory cells arranged in a matrix form, each memory cell having a circuit configuration as will later be described. The memory cells arranged in the same column are connected to the same bit lines, and the memory cells arranged in the same row are connected to the same word line.

The mode selector 46 receives mode input signals from an exterior of the device, and decodes the mode input signal to determine an operation mode (e.g., a write operation mode or a read operation mode). Control signals responsive to the determined operation mode are supplied to the write amplifier 44, the sense amplifier & column selector 45, the row signal driver 48, etc., for control of the individual parts of the semiconductor memory device 40.

The column decoder 43 receives a column address input from the exterior of the device, and decodes the column address input to determine a selected column. The decode signals indicative of the selected column are supplied to the write amplifier 44 and the sense amplifier & column selector 45.

The row decoder 47 receives a row address input from the exterior of the device, and decodes the row address input to determine a selected row. The decode signals indicative of the selected row are supplied to the row signal driver 48.

In response to the control signals from the mode selector 46 and the decode signals from the row decoder 47, the row signal driver 48 activates a selected word line among the word lines extending from the row signal driver 48. As a result of the activation of the selected word line, a data transfer unit (such as the data transfer unit 17 of FIG. 5) of each memory cell connected to the selected word line couples a volatile memory unit (such as the volatile memory unit 16 of FIG. 5) to a corresponding bit line pair among a plurality of bit line pairs. Through this coupling, the writing/reading of data to/from the volatile memory portion is performed.

In response to the control signals from the mode selector 46 and the decode signals from the column decoder 43, the sense amplifier & column selector 45 couples bit lines corresponding to the selected column to a data bus. Through this coupling, data is transferred between the memory cell array 49 and the data bus. The sense amplifier & column selector 45 amplifies the data read from the memory cell array 49 for provision to the output buffer 42. The data is output from the output buffer 42 to the exterior of the device as output data. Input data supplied to the input buffer 41 is provided to the write amplifier 44. The write amplifier 44 amplifies the input data to be written to the memory cell array 49.

Figure 11:
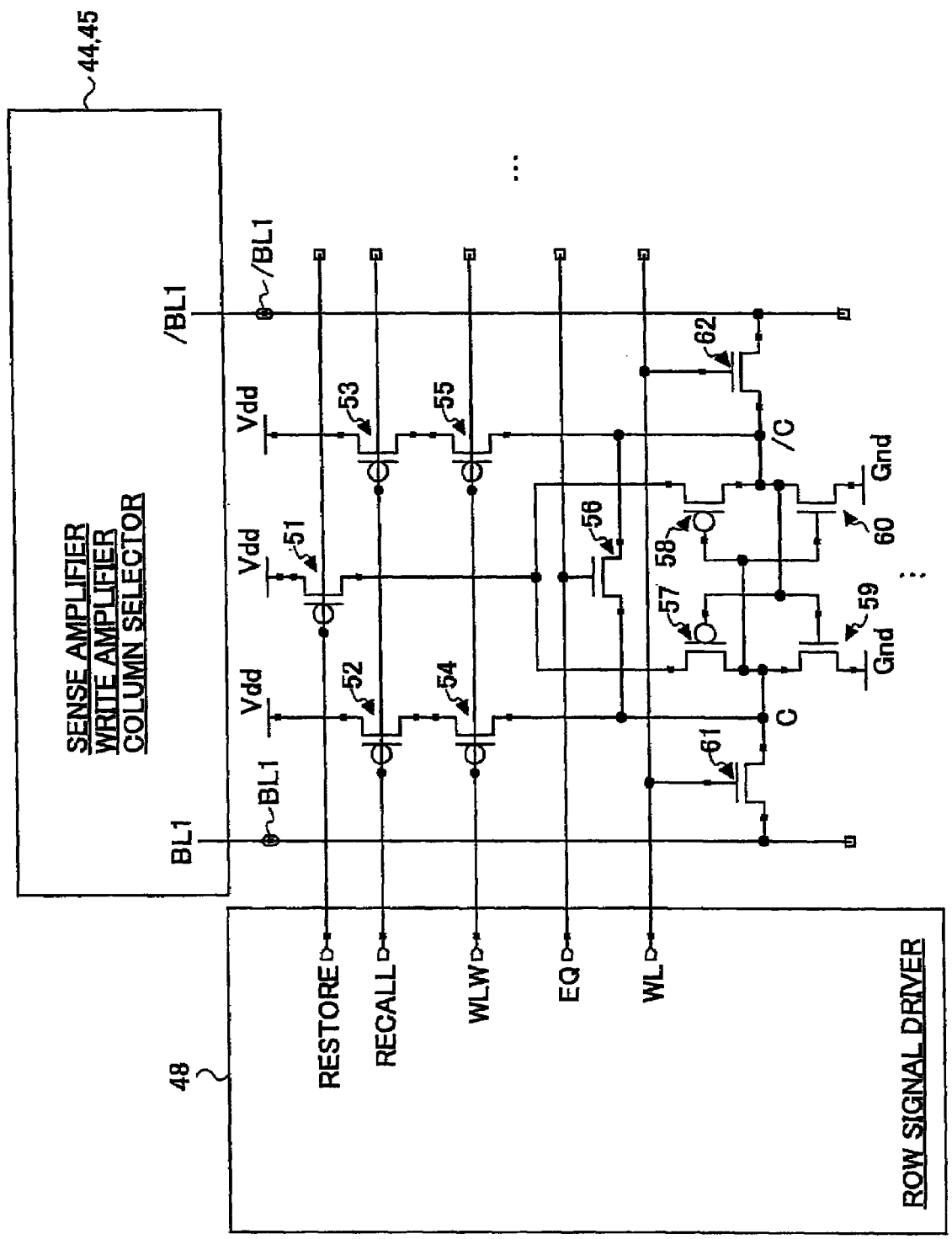
FIG. 11 is an illustrative drawing showing the configuration of a memory cell according to a first embodiment of the nonvolatile memory device of the present invention.

FIG. 11 is an illustrative drawing showing the configuration of a memory cell according to a first embodiment of the nonvolatile memory device of the present invention. The memory cell includes PMOS transistors 51 through 55, an NMOS transistor 56, PMOS transistors 57 and 58, and NMOS transistors 59 through 62. The NMOS transistors 61 and 62 correspond to the data transfer unit 17 shown in FIG. 6. The PMOS transistors 57 and 58 and NMOS transistors 59 and 60 together constitute a latch (flip-flop), which corresponds to the volatile memory unit 16 of the memory circuit shown in FIG. 6. The PMOS transistors 52 through 55 correspond to the PMOS transistors 11, 12, 14, and 15 constituting the nonvolatile memory unit of the memory circuit shown in FIG. 6.

It is preferable to manufacture the PMOS transistors 54 and 55 such that their gate oxide film is thinner than that of other transistors. In this manner, the PMOS transistors 54 and 55 are designed to operate with a low operating voltage (e.g., 1.0 V to 1.8 V), and the other transistors are designed to operate with a higher operating voltage (e.g., 3.3 V).

As shown in FIG. 11, bit lines BL1 and /BL1 extend from the write amplifier 44 and the sense amplifier & column selector 45, and are coupled to the volatile memory unit via the NMOS transistors 61 and 62 serving as the data transfer unit. A word selecting line WLW extends from the row signal driver 48, and is coupled to the gate nodes of the PMOS transistors 54 and 55 serving as the nonvolatile memory unit. A word line WL extends from the row signal driver 48 to be connected to the gates of the NMOS transistors 61 and 62. Further, a restore line RESTORE, recall line RECALL, and equalize line EQ also extend from the row signal driver 48.

It should be noted that the configuration shown in FIG. 11 is identical with respect to each and every one of the memory cells provided in the memory cell array 49. Namely, multiple sets of the lines RESTORE, RECALL, WLW, EQ, and WL are provided in one-to-one correspondence to the rows of the memory cell array 49.

Figure 12:
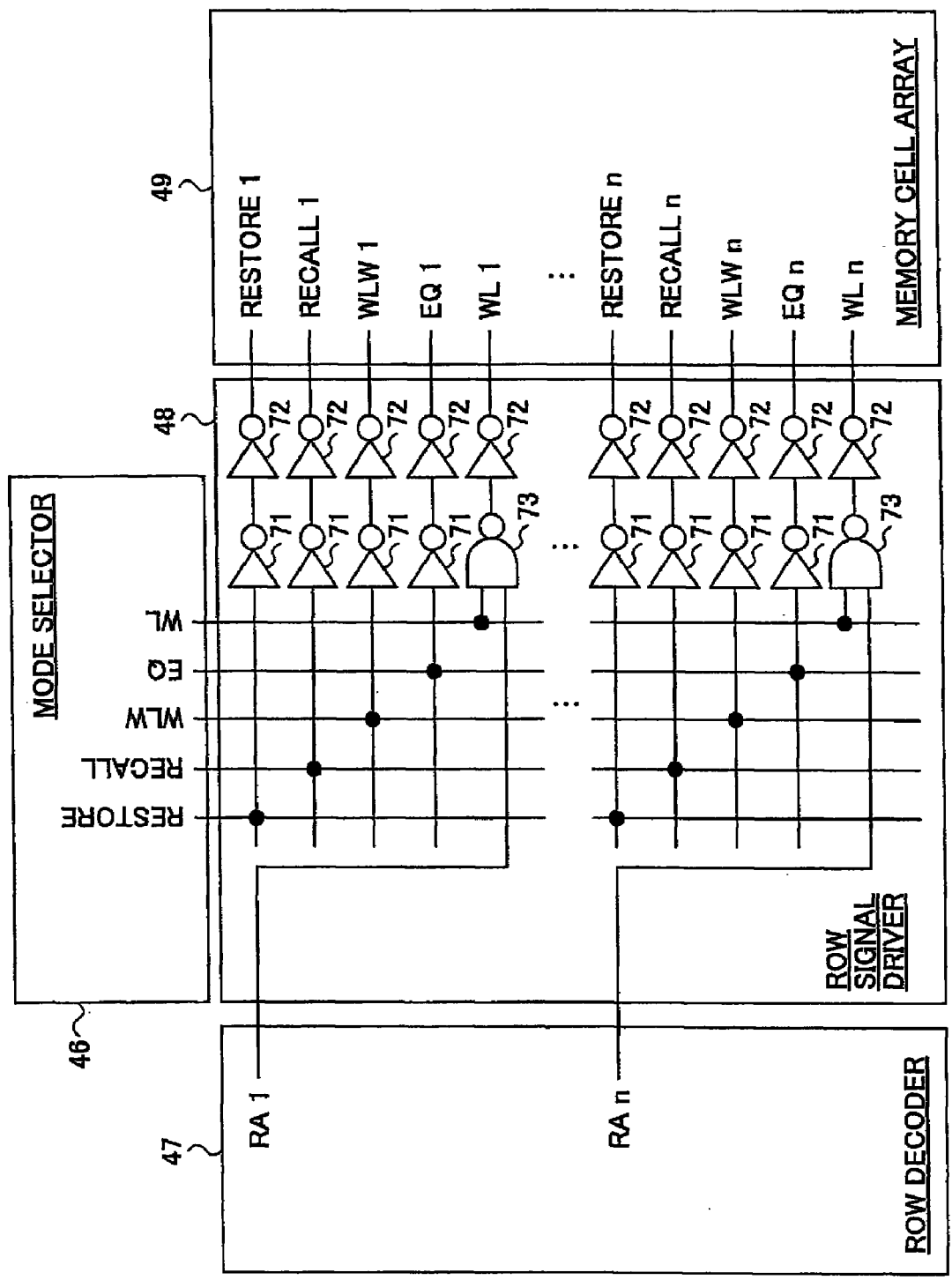
FIG. 12 is a drawing showing the multiple sets of lines extending from a row signal driver and their relations with a mode selector and row decoder.

FIG. 12 is a drawing showing the multiple sets of the lines extending from the row signal driver 48 and their relations with the mode selector 46 and the row decoder 47. In this configuration, store operation (storing data from the volatile memory unit to the nonvolatile memory unit) and recall operation (reading data from the nonvolatile memory unit to the volatile memory unit) are performed with respect to the entirety of the memory cell array 49, rather than performed on a row-address-specific basis. Read/write operations of the volatile memory unit with respect to the bit lines BL1 and /BL1 are of course performed on a row-address-specific basis.

As shown in FIG. 12, the mode selector 46 supplies signals RESTORE, RECALL, WLW, EQ, and WL to the row signal driver 48. The signals RESTORE, RECALL, WLW, and EQ are directly coupled to the corresponding lines of each row, and are thus output from the row signal driver 48 to the memory cell array 49 as RESTORE1, RECALL1, WLW1, EQ1, and WL1 for a row address RA1 and RESTOREn, RECALLn, WLWn, EQn, and WLn for a row address RAn, for example. The inverters 71 and 72 are used as output buffers for these signals.

The signal WL supplied from the mode selector 46 and each row address signal are combined by a corresponding NAND gate 73, an output of which is inverted by the inverter 72 for provision to the memory cell array 49. Thus, only one of the signals WL1 through WLn is supplied to the memory cell array 49 so as to activate a selected row address.

In this configuration, as described above, the store operation and recall operation are performed with respect to the entirety of the memory cell array 49. Alternatively, the store operation and recall operation may be performed separately for each row address. In such a case, the signals RESTORE, RECALL, WLW, and EQ supplied from the mode selector 46 are combined with each row address signal in the row signal driver 48 such as to achieve a proper row-address-specific store operation and recall operation.

Figure 13:
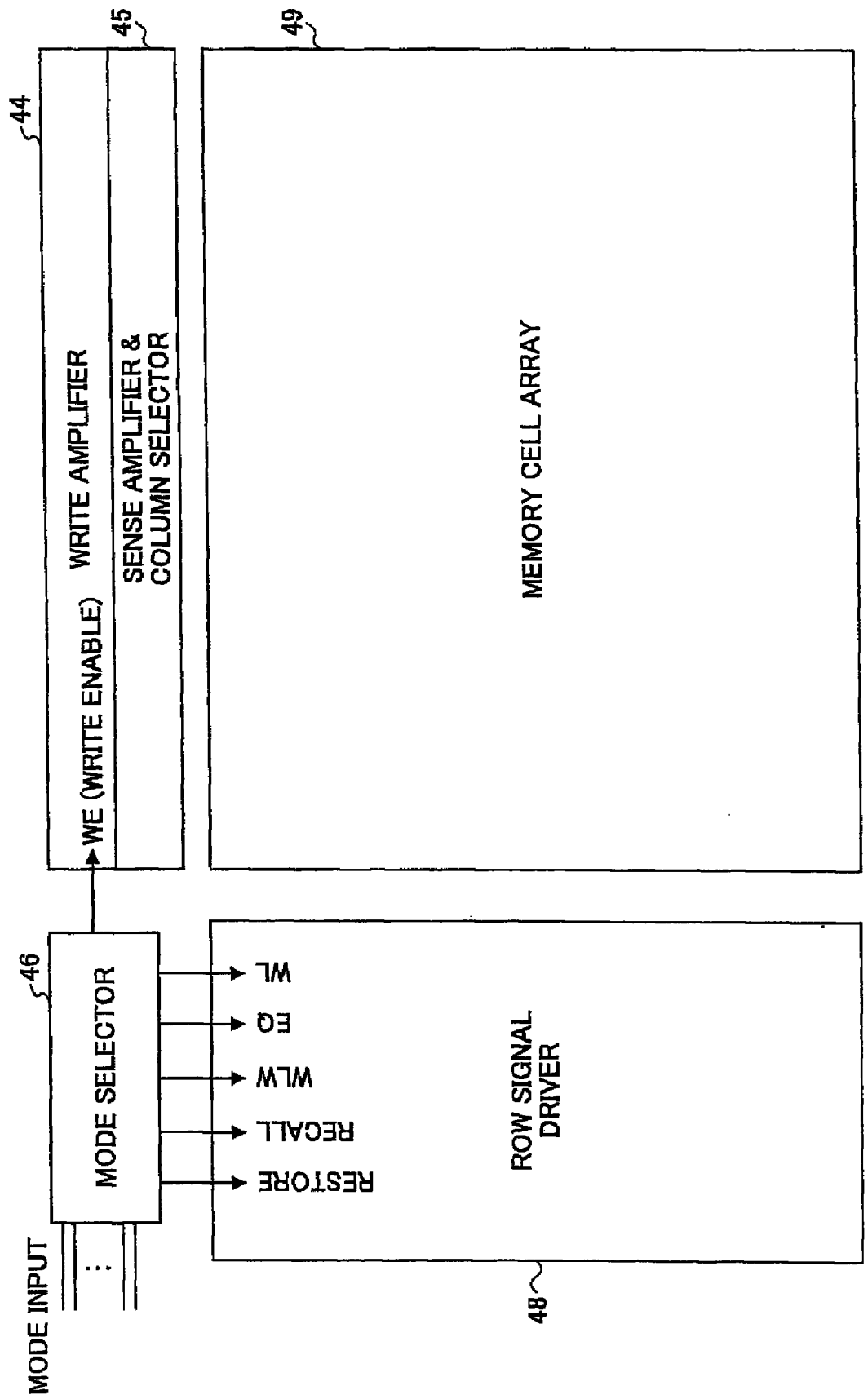
FIG. 13 is a drawing showing the flow of control signals output from the mode selector.

FIG. 13 is a drawing showing the flow of control signals output from the mode selector 46. As shown in FIG. 13, the mode selector 46 receives and decodes the mode input signals, and supplies various control signals to the row signal driver 48 and the write amplifier 44. Specifically, the control signals RESTORE, RECALL, WLW, EQ, and WL are supplied to the row signal driver 48, and a write enable signal WE is supplied to the write amplifier 44.

FIG. 14 is a table chart showing the signal levels of the control signals that are defined with respect to each operation. The columns of the table correspond to the respective control signals RESTORE, RECALL, WLW, EQ, WL, and WE, which are generated by the mode selector 46 in response to the mode input signals supplied from an exterior of the device. The rows of the table correspond to respective operations "Write", "Read", "Store", "Recall", and "Standby". "Write" refers to the operation that writes data to the volatile memory unit. "Read" refers to the operation that reads data from the volatile memory unit. "Store" refers to the operation that writes data from the volatile memory unit to the nonvolatile memory unit. "Recall" refers to the operation that reads data from the nonvolatile memory unit to the volatile memory unit. "Standby" refers to the state in which data is maintained in the volatile memory unit.

The mode selector 46 sets the control signals to signal levels (signal states) as shown in the table of FIG. 14 in response to the mode input signals. Through such settings of the control signals, the mode selector 46 controls the write amplifier 44 and the row signal driver 48 to perform a requested operation with respect to the memory cell array 49.

Figure 15:
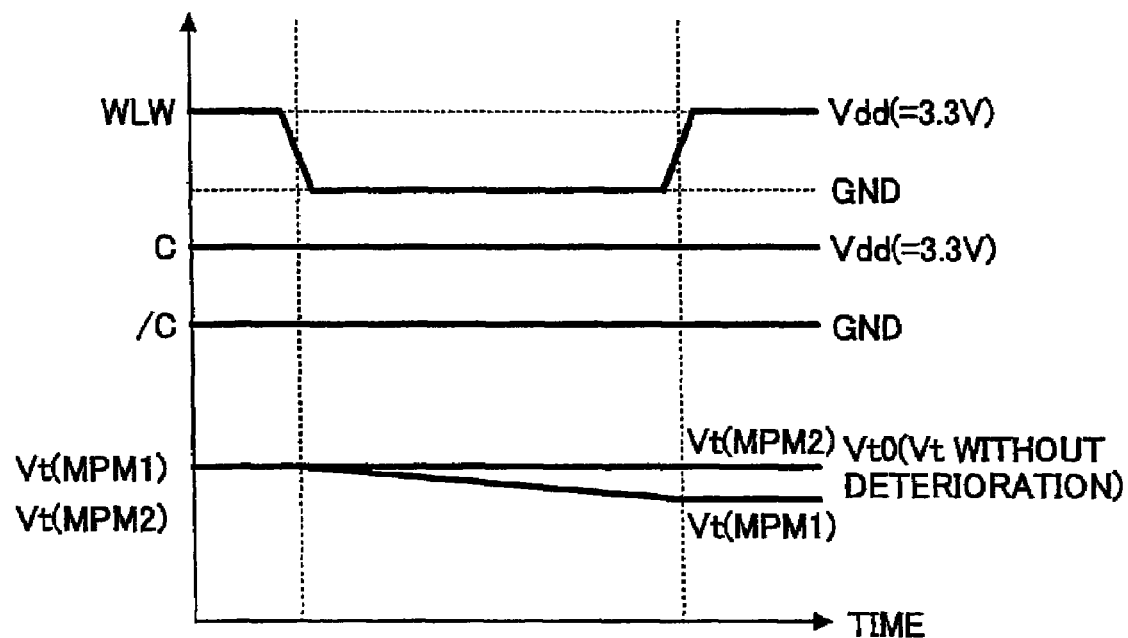
FIG. 15 is a signal waveform diagram for explaining the store operation of the nonvolatile memory device of the present invention.

FIG. 15 is a signal waveform diagram for explaining the store operation of the nonvolatile memory device of the present invention. When the mode input from the exterior of the device indicates a store operation, the control signals RESTORE, RECALL, WLW, EQ, WL, and WE are set to 0, 1, 0, 0, 0, and 0, respectively, as shown in FIG. 14. The setting of the word selecting line WLW to 0 (LOW) is shown in FIG. 15.

Since the signal RECALL is set to 1, the PMOS transistors 52 and 53 shown in FIG. 11 are made nonconductive. In the configuration of FIG. 11, thus, the PMOS transistor 54 has the source node thereof coupled to a floating node and the drain node thereof coupled to a node C of the volatile memory unit, and the PMOS transistor 55 has the source node thereof coupled to a floating node and the drain node thereof coupled to a node /C of the volatile memory unit. Here, the potentials of the node C and the node /C are inverse to each other, and the data stored in the latch (PMOS transistors 57 and 58 and NMOS transistors 59 and 60) determines which one of the nodes C and /C is HIGH.

In an example shown in FIG. 15, the node C is HIGH (Vdd=3.3 V), and the node /C is LOW (GND). As a result, only the PMOS transistor 54 (denoted as MPM1 in FIG. 15) experiences a drop in the threshold voltage Vt. The PMOS transistor 55 (denoted as MPM2 in FIG. 15) does not experience a change in the threshold voltage Vt. This achieves the storing of the data of the volatile memory unit in the nonvolatile memory unit.

Figure 16:
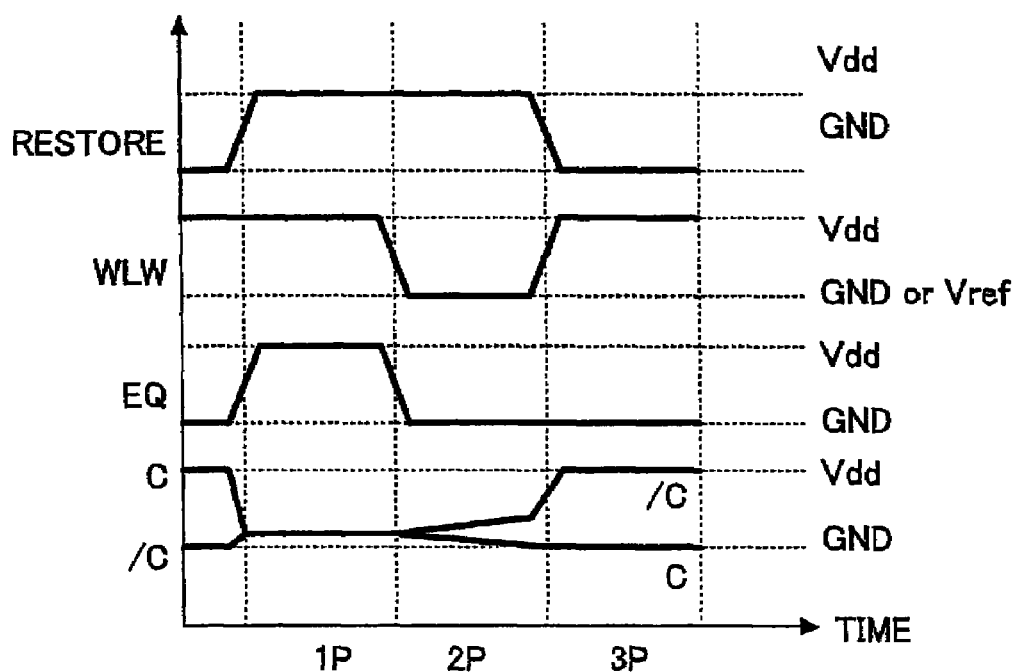
FIG. 16 is a signal waveform diagram for explaining the recall operation of the first embodiment of the nonvolatile memory device according to the present invention.

FIG. 16 is a signal waveform diagram for explaining the recall operation of the first embodiment of the nonvolatile memory device according to the present invention. When the mode input from the exterior of the device indicates a recall operation, the control signals RESTORE, RECALL, WLW, EQ, WL, and WE are set to 1-1-0, 0, 1-0-1, 1-0-0, 0, and 0, respectively, as shown in FIG. 14. Here, 1-1-0, for example, indicates that the signal level is set to 1 at the first phase, 1 at the second phase, and 0 at the third phase. The first, second, and third phases are shown in FIG. 16 as 1P, 2P, and 3P, respectively.

At the first phase 1P, the signal RESTORE is set to 1, and the signal EQ is set to 1. As a result, the PMOS transistor 51 in FIG. 11 becomes nonconductive to deactivate the volatile memory unit, and the NMOS transistor 56 in FIG. 11 becomes conductive to equalize the nodes C and /C. The equalization of the nodes C and /C is shown in FIG. 16 as occurring at the first phase 1P.

At the second phase 2P, the signal EQ is set to 0, and the word selecting line WLW is set to 0. As a result, the NMOS transistor 56 is turned off to separate the nodes C and /C from each other, and the PMOS transistors 54 and 55 are turned on. Assuming that the store operation as shown in FIG. 15 has been performed prior to the recall operation, the PMOS transistor 54 has a lower threshold voltage, and thus has a higher ON resistance. Accordingly, the force that pulls up the node C is weaker than the force that pulls up the node /C, resulting in the nodes C and /C changing to LOW and HIGH, respectively, as shown at the second phase 2P in FIG. 16.

The second phase may be set to a significantly shorter time length than the time length required for the store operation. Such provision makes it possible to suppress a change in the transistor characteristics through NBTI at the time of the recall operation. Alternatively or additionally, the word selecting line WLW may be set to Vref rather than GND as shown in FIG. 16 where Vref is an intermediate voltage between the power supply voltage Vdd and the ground voltage GND. Such provision reduces a voltage applied between the gate node and source/drain nodes of the PMOS transistors 54 and 55, thereby suppressing a change in the transistor characteristics through NBTI at the time of the recall operation.

At the third phase, the signal RESTORE is set to 0, and the word selecting line WLW is set to 1. As a result, the PMOS transistor 51 in FIG. 11 becomes conductive to activate the volatile memory unit, and the PMOS transistors 54 and 55 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 16.

Figure 17:
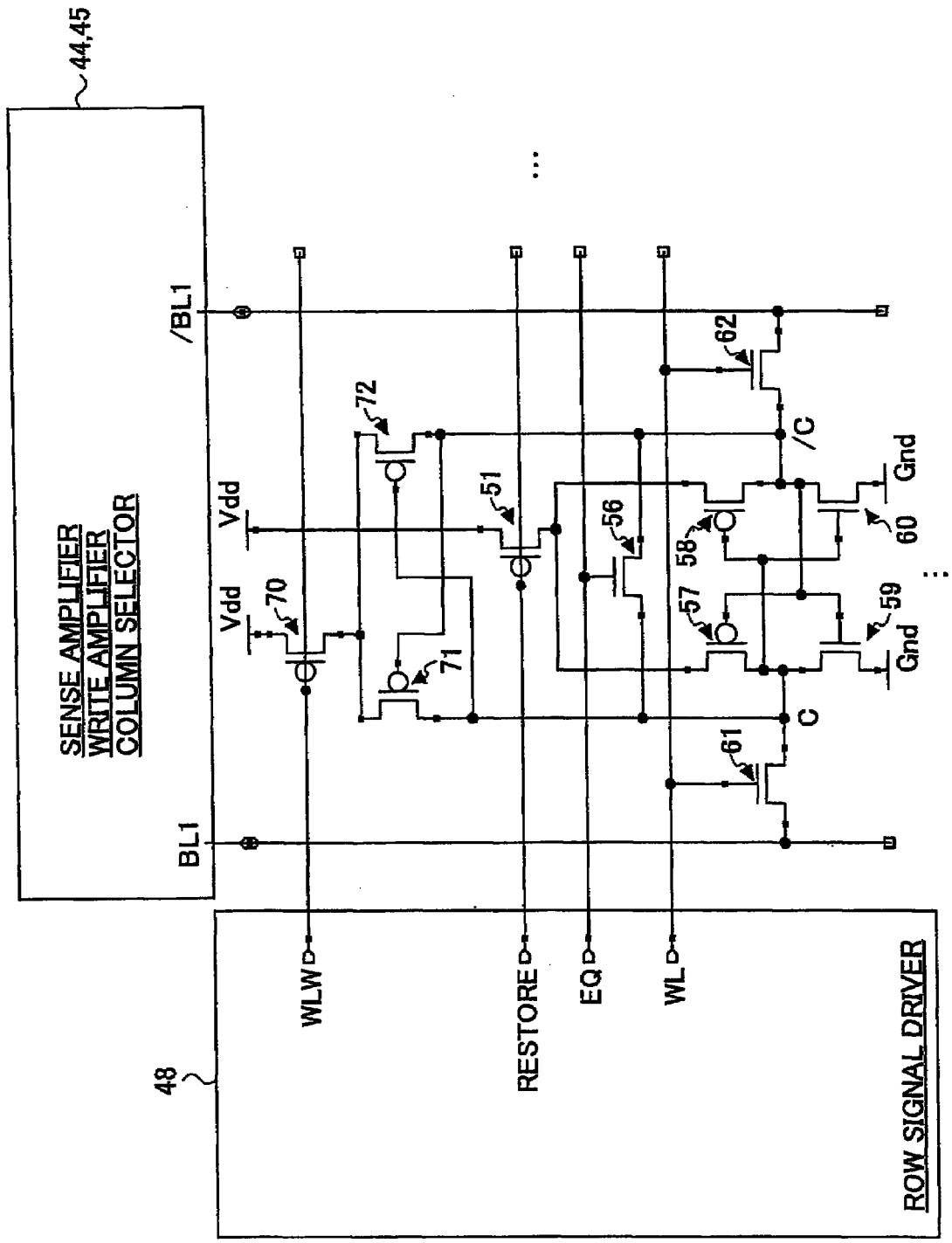
FIG. 17 is an illustrative drawing showing the configuration of a memory cell according to a second embodiment of the nonvolatile memory device of the present invention.

FIG. 17 is an illustrative drawing showing the configuration of a memory cell according to a second embodiment of the nonvolatile memory device of the present invention. The same elements as those of FIG. 11 are referred to by the same numerals, and a description thereof will be omitted unless necessary.

The memory cell includes PMOS transistors 70 through 72, in addition to the PMOS transistor 51, the NMOS transistor 56, the PMOS transistors 57 and 58, and the NMOS transistors 59 through 62 that are the same transistors as shown in FIG. 11. The PMOS transistors 70 through 72 correspond to the PMOS transistors 11 through 13 that serve as a nonvolatile memory unit of the memory circuit shown in FIG. 5.

As shown in FIG. 17, a word selecting line WLW extends from the row signal driver 48, and is coupled to the gate node of the PMOS transistor 70. A word line WL extends from the row signal driver 48 to be connected to the gates of the NMOS transistors 61 and 62. Further, a restore line RESTORE and an equalize line EQ also extend from the row signal driver 48.

It should be noted that the configuration shown in FIG. 17 is identical with respect to each and every one of the memory cells provided in the memory cell array 49. Namely, multiple sets of the lines WLW, RESTORE, EQ, and WL are provided in one-to-one correspondence to the rows of the memory cell array 49.

FIG. 18 is a table chart showing the signal levels of the control signals that are defined with respect to each operation. The columns of the table correspond to the respective control signals RESTORE, WLW, EQ, WL, and WE, which are generated by the mode selector 46 in response to the mode input signals supplied from an exterior of the device.

Figure 19:
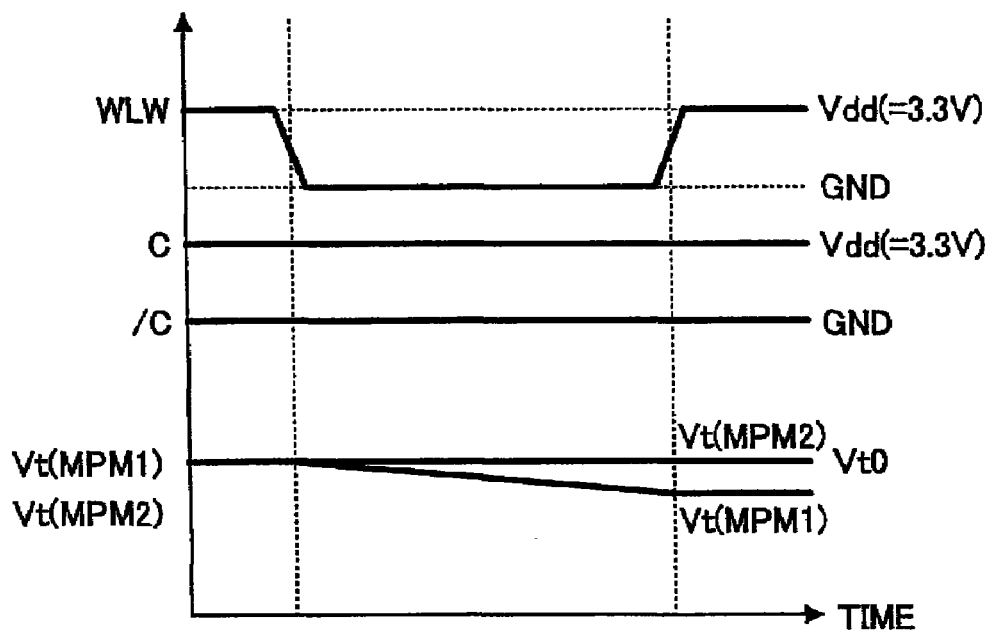
FIG. 19 is a signal waveform diagram for explaining the store operation of the nonvolatile memory device of the present invention.

FIG. 19 is a signal waveform diagram for explaining the store operation of the nonvolatile memory device of the present invention. When the mode input from the exterior of the device indicates a store operation, the control signals RESTORE, WLW, EQ, WL, and WE are set to 1, 0, 0, 0, and 0, respectively, as shown in FIG. 18. The setting of the word selecting line WLW to 0 (LOW) is shown in FIG. 19.

Since the word selecting line WLW is set to 0, the PMOS transistor 70 shown in FIG. 17 is made conductive. In the configuration of FIG. 17, thus, the PMOS transistor 71 has the source node thereof coupled to the power supply voltage Vdd and the drain node thereof coupled to the node C of the volatile memory unit, and the PMOS transistor 72 has the source node thereof coupled to the power supply voltage Vdd and the drain node thereof coupled to the node /C of the volatile memory unit. Further, the node C is coupled to the gate node of the PMOS transistor 72, and the node /C is coupled to the gate node of the PMOS transistor 71.

In an example shown in FIG. 19, the node C is HIGH (Vdd=3.3 V), and the node /C is LOW (GND). As a result, only the PMOS transistor 71 (denoted as MPM1 in FIG. 19) experiences a drop in the threshold voltage Vt. The PMOS transistor 72 (denoted as MPM2 in FIG. 19) does not experience a change in the threshold voltage Vt. This achieves the storing of the data of the volatile memory unit in the nonvolatile memory unit.

Figure 20:
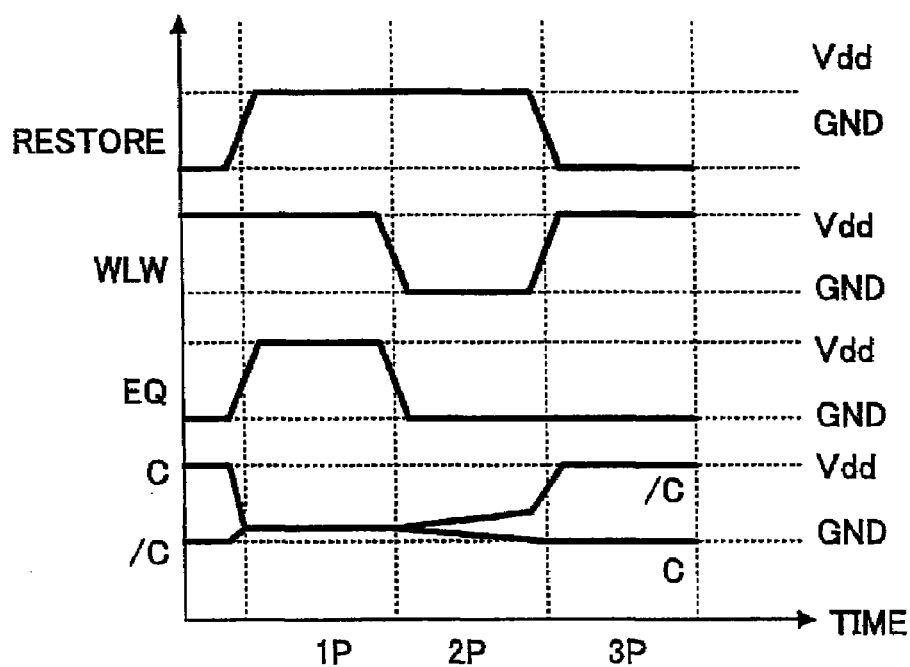
FIG. 20 is a signal waveform diagram for explaining the recall operation of the second embodiment of the nonvolatile memory device according to the present invention.

FIG. 20 is a signal waveform diagram for explaining the recall operation of the second embodiment of the nonvolatile memory device according to the present invention. When the mode input from the exterior of the device indicates a recall operation, the control signals RESTORE, WLW, EQ, WL, and WE are set to 1-1-0, 1-0-1, 1-0-0, 0, and 0, respectively, as shown in FIG. 18.

At the first phase 1P, the signal RESTORE is set to 1, and the signal EQ is set to 1. As a result, the PMOS transistor 51 in FIG. 17 becomes nonconductive to deactivate the volatile memory unit, and the NMOS transistor 56 in FIG. 17 becomes conductive to equalize the nodes C and /C. The equalization of the nodes C and /C is shown in FIG. 20 as occurring at the first phase 1P.

At the second phase 2P, the signal EQ is set to 0, and the word selecting line WLW is set to 0. As a result, the NMOS transistor 56 is turned off to separate the nodes C and /C from each other, and the PMOS transistor 70 is turned on. Assuming that the store operation as shown in FIG. 19 has been performed prior to the recall operation, the PMOS transistor 71 has a lower threshold voltage, and thus has a higher ON resistance. Accordingly, the force that pulls up the node C is weaker than the force that pulls up the node /C, resulting in the nodes C and /C changing to LOW and HIGH, respectively, as shown at the second phase 2P in FIG. 20.

At the third phase, the signal RESTORE is set to 0, and the word selecting line WLW is set to 1. As a result, the PMOS transistor 51 in FIG. 17 becomes conductive to activate the volatile memory unit, and the PMOS transistor 70 is turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 20.

Figure 21:
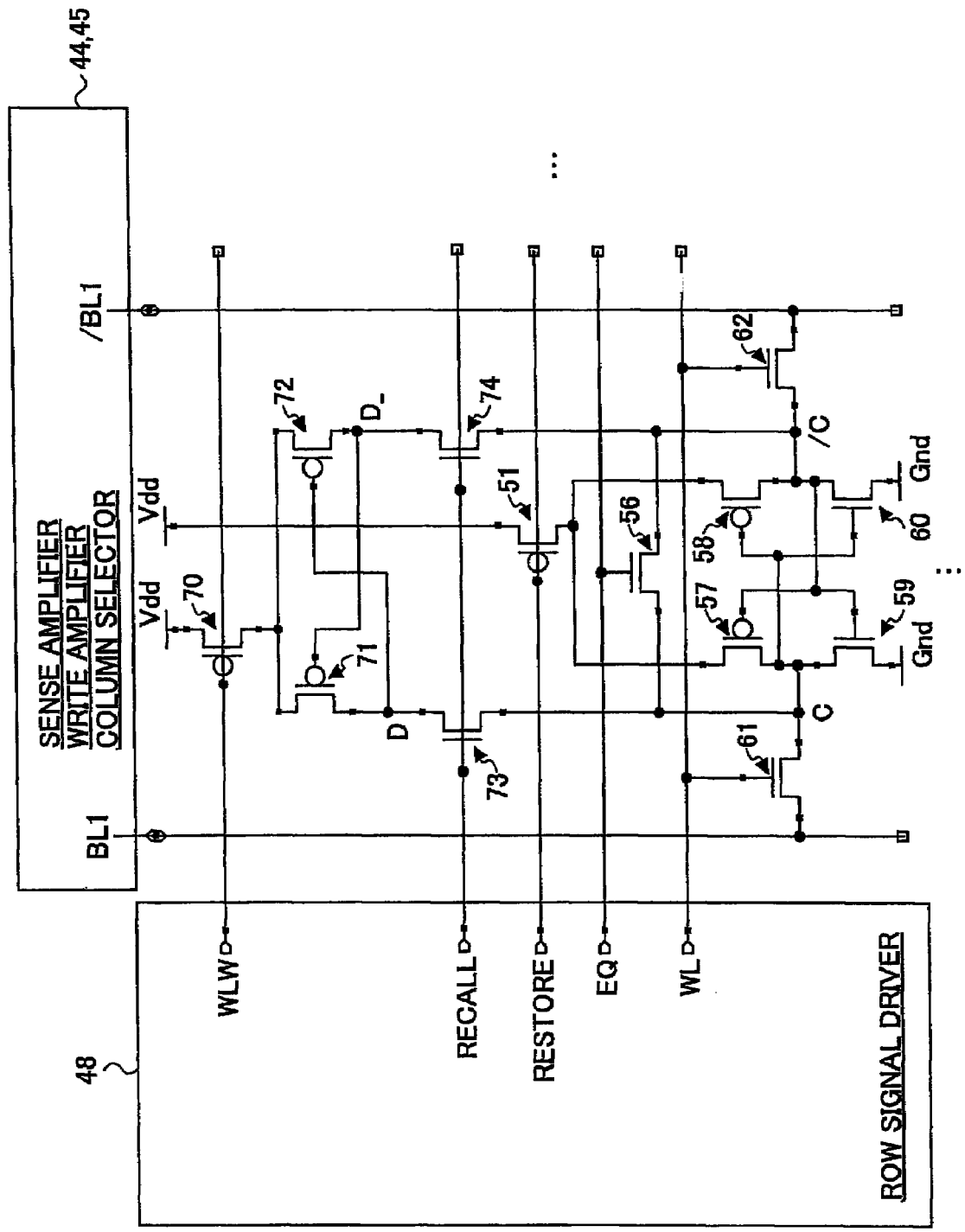
FIG. 21 is an illustrative drawing showing the configuration of a memory cell according to a third embodiment of the nonvolatile memory device of the present invention.

FIG. 21 is an illustrative drawing showing the configuration of a memory cell according to a third embodiment of the nonvolatile memory device of the present invention. The same elements as those of FIG. 11 and FIG. 17 are referred to by the same numerals, and a description thereof will be omitted unless necessary.

The memory cell includes NMOS transistors 73 and 74 in addition to the configuration of the memory cell shown in FIG. 17. The nonvolatile memory unit comprised of the PMOS transistors 70 through 72 is coupled to a power supply potential Vpp that is higher than Vdd. A recall line RECALL extending from the row signal driver 48 is coupled to the gate nodes of the newly provided NMOS transistors 73 and 74. The NMOS transistors 73 and 74, when turned off, separate the nonvolatile memory unit (i.e., the PMOS transistors 71 and 72) from the volatile memory unit (i.e., from the nodes C and /C).

FIG. 22 is a table chart showing the signal levels of the control signals that are defined with respect to each operation. The columns of the table correspond to the respective control signals RESTORE, RECALL, WLW, EQ, WL, and WE, which are generated by the mode selector 46 in response to the mode input signals supplied from an exterior of the device. It should be noted that the word selecting line WLW operates with the operating range from Vpp to GND while the other signal lines operate with the operating range from Vdd to GND.

Figure 23:
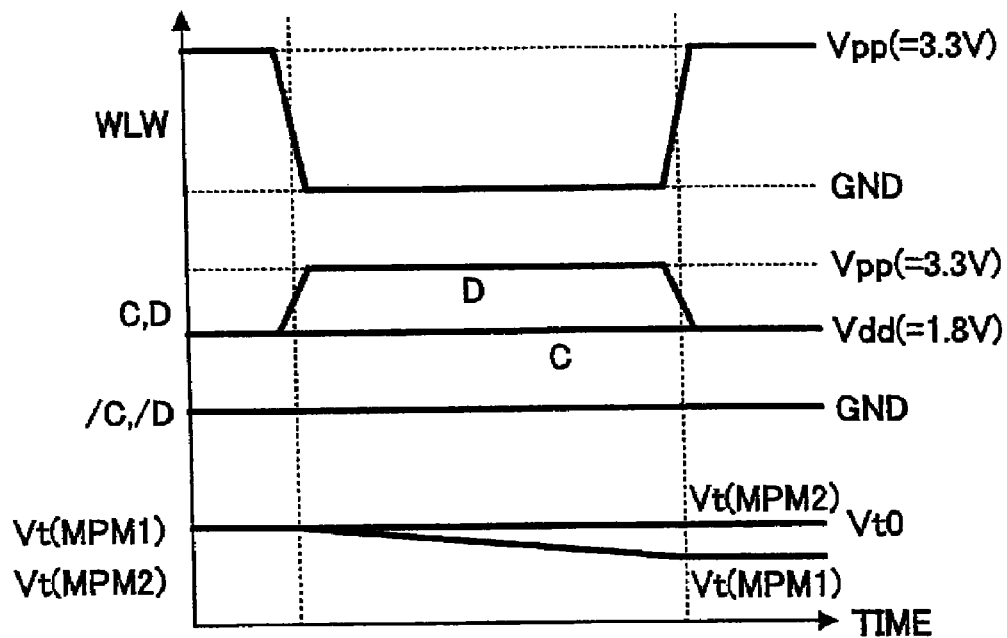
FIG. 23 is a signal waveform diagram for explaining the store operation of the nonvolatile memory device of the present invention.

FIG. 23 is a signal waveform diagram for explaining the store operation of the nonvolatile memory device of the present invention. When the mode input from the exterior of the device indicates a store operation, the control signals RESTORE, RECALL, WLW, EQ, WL, and WE are set to 1, 1, 0, 0, 0, and 0, respectively, as shown in FIG. 22. The setting of the word selecting line WLW to 0 (LOW) is shown in FIG. 23.

Since the word selecting line WLW is set to 0, the PMOS transistor 70 shown in FIG. 21 is made conductive. Further, the signal RECALL is set to 1, thereby turning on the NMOS transistors 73 and 74 to couple the nonvolatile memory unit to the volatile memory unit, i.e., to couple nodes D and /D (see FIG. 21) to the nodes C and /C. In the configuration of FIG. 21, thus, the PMOS transistor 71 has the source node thereof coupled to the power supply voltage Vpp and the drain node thereof coupled to the node C, and the PMOS transistor 72 has the source node thereof coupled to the power supply voltage Vpp and the drain node thereof coupled to the node /C.

In an example shown in FIG. 23, the node C is HIGH (Vdd=1.8 V), and the node /C is LOW (GND). Further, the node D is HIGH (Vpp=3.3 V), and the node /D is LOW (GND). As a result, only the PMOS transistor 71 (denoted as MPM1 in FIG. 23) experiences a drop in the threshold voltage Vt. The PMOS transistor 72 (denoted as MPM2 in FIG. 23) does not experience a change in the threshold voltage Vt. This achieves the storing of the data of the volatile memory unit in the nonvolatile memory unit.

It should be noted that the higher power supply potential Vpp is applied only to the nonvolatile memory unit. When the NMOS transistors 73 and 74 are turned on, the potentials of the nodes C and /C connected to the source nodes of the NMOS transistors 73 and 74 do not rise above the voltage that is the gate potential RECALL minus the threshold voltage. Accordingly, the volatile memory unit always operates with the operating voltage from Vdd to GND.

It is preferable to manufacture the PMOS transistors 71 and 72 such that their gate oxide film is thinner than that of other transistors. In this manner, the PMOS transistors 71 and 72 are designed to operate with a low operating voltage (e.g., 1.0 V to 1.8 V), and the other transistors are designed to operate with a higher operating voltage (3.3 V).

Figure 24:
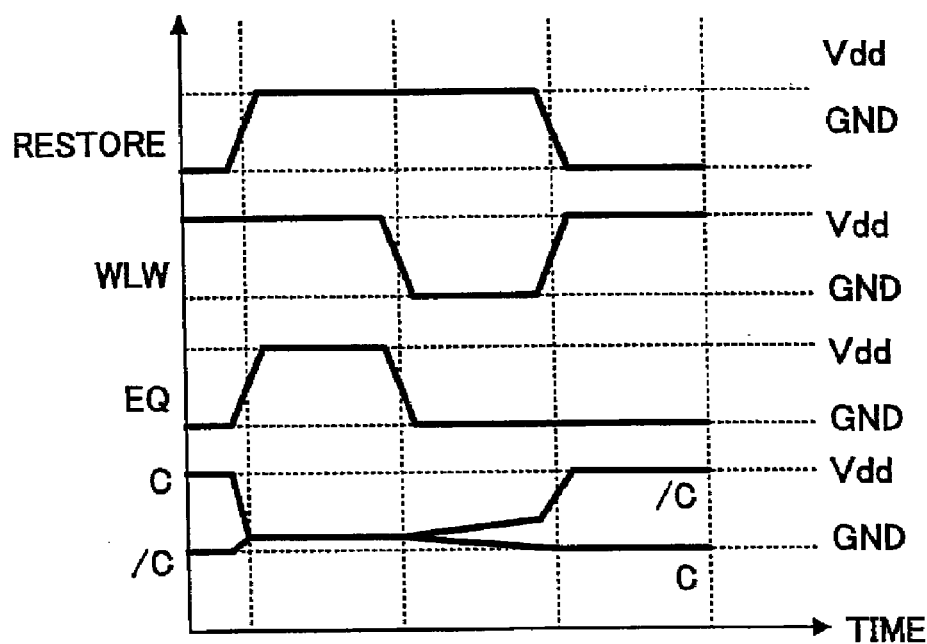
FIG. 24 is a signal waveform diagram for explaining the recall operation of the third embodiment of the nonvolatile memory device according to the present invention.

FIG. 24 is a signal waveform diagram for explaining the recall operation of the third embodiment of the nonvolatile memory device according to the present invention. The recall operation of the third embodiment is substantially the same as the recall operation of the second embodiment. In the third embodiment, the recall signal RECALL is set to 1 during the recall operation.

In the first through third embodiment of the nonvolatile memory device according to the present invention, when data of the volatile memory unit is stored in the nonvolatile memory unit, and is then recalled from the nonvolatile memory unit for storage in the volatile memory unit, the recalled data is inverted from the original data. Embodiments which will be described in the following are designed to address this issue.

Figure 25:
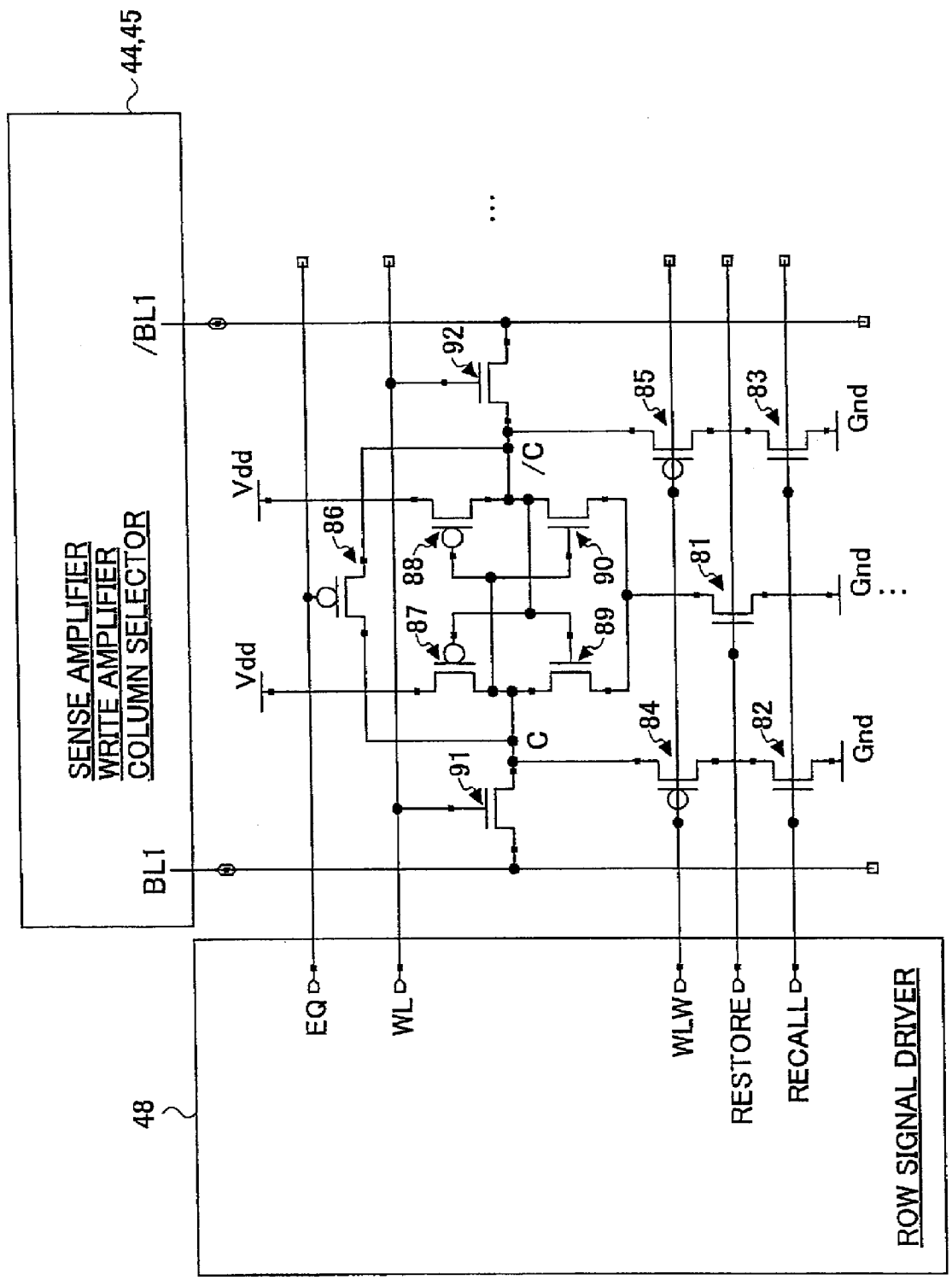
FIG. 25 is an illustrative drawing showing the configuration of a memory cell according to a fourth embodiment of the nonvolatile memory device of the present invention.

FIG. 25 is an illustrative drawing showing the configuration of a memory cell according to a fourth embodiment of the nonvolatile memory device of the present invention. The memory cell includes NMOS transistors 81 through 83, PMOS transistors 84 through 88, and NMOS transistors 89 through 92. The NMOS transistors 91 and 92 serve as a data transfer unit. The PMOS transistors 87 and 88 and NMOS transistors 89 and 90 together constitute a latch (flip-flop), which serves as a volatile memory unit. The PMOS transistors 84 and 85 and NMOS transistors 82 and 83 serve as a nonvolatile memory unit. In particular, the PMOS transistors 84 and 85 correspond to the PMOS transistors 11 and 12 shown in FIG. 3.

It is preferable to manufacture the PMOS transistors 84 and 85 such that their gate oxide film is thinner than that of other transistors. In this manner, the PMOS transistors 84 and 85 are designed to operate with a low operating voltage (e.g., 1.0 V to 1.8 V), and the other transistors are designed to operate with a higher operating voltage (3.3 V).

As shown in FIG. 25, bit lines BL1 and /BL1 extend from the write amplifier 44 and the sense amplifier & column selector 45, and are coupled to the volatile memory unit via the NMOS transistors 91 and 92 serving as the data transfer unit. A word selecting line WLW extends from the row signal driver 48, and is coupled to the gate nodes of the PMOS transistors 84 and 85 serving as the nonvolatile memory unit. A word line WL extends from the row signal driver 48 to be connected to the gates of the NMOS transistors 91 and 92. Further, a restore line RESTORE, recall line RECALL, and equalize line EQ also extend from the row signal driver 48.

It should be noted that the configuration shown in FIG. 11 is identical with respect to each and every one of the memory cells provided in the memory cell array 49. Namely, multiple sets of the lines RESTORE, RECALL, WLW, EQ, and WL are provided in one-to-one correspondence to the rows of the memory cell array 49.

FIG. 26 is a table chart showing the signal levels of the control signals that are defined with respect to each operation. The columns of the table correspond to the respective control signals RESTORE, RECALL, WLW, EQ, WL, and WE, which are generated by the mode selector 46 in response to the mode input signals supplied from an exterior of the device. The rows of the table correspond to respective operations "Write", "Read", "Store", "Recall", and "Standby".

Figure 27:
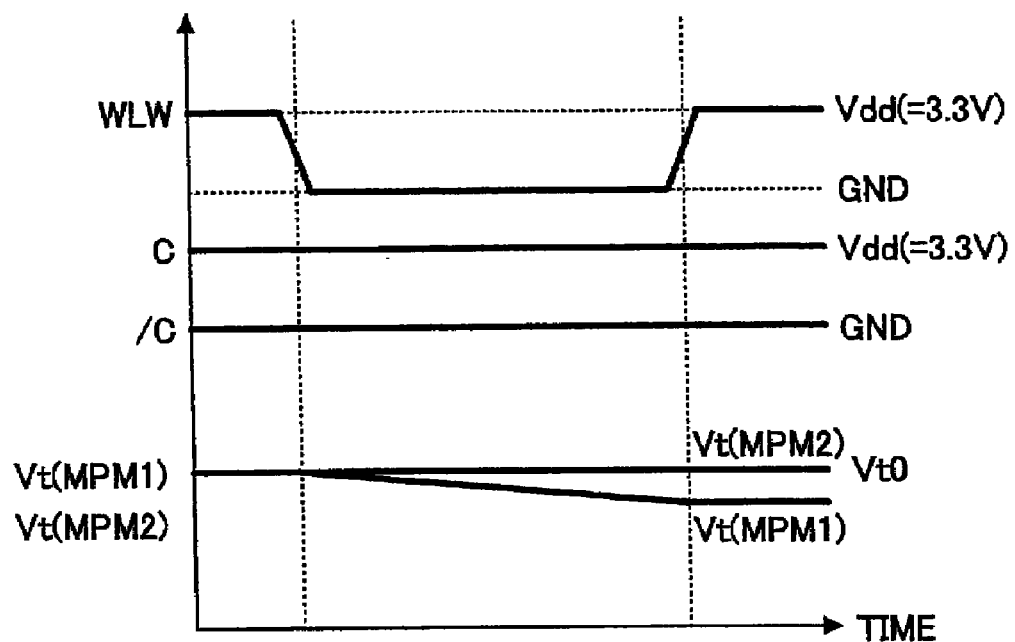
FIG. 27 is a signal waveform diagram for explaining the store operation of the nonvolatile memory device of the present invention.

FIG. 27 is a signal waveform diagram for explaining the store operation of the nonvolatile memory device of the present invention. When the mode input from the exterior of the device indicates a store operation, the control signals RESTORE, RECALL, WLW, EQ, WL, and WE are set to 1, 0, 0, 1, 0, and 0, respectively, as shown in FIG. 26. The setting of the word selecting line WLW to 0 (LOW) is shown in FIG. 27.

Since the signal RECALL is set to 0, the NMOS transistors 82 and 83 shown in FIG. 25 are made nonconductive. In the configuration of FIG. 25, thus, the PMOS transistor 84 has the drain node thereof coupled to a floating node and the source node thereof coupled to the node C of the volatile memory unit, and the PMOS transistor 85 has the drain node thereof coupled to a floating node and the source node thereof coupled to the node /C of the volatile memory unit.

In an example shown in FIG. 27, the node C is HIGH (Vdd=3.3 V), and the node /C is LOW (GND). As a result, only the PMOS transistor 84 (denoted as MPM1 in FIG. 27) experiences a drop in the threshold voltage Vt. The PMOS transistor 85 (denoted as MPM2 in FIG. 27) does not experience a change in the threshold voltage Vt. This achieves the storing of the data of the volatile memory unit in the nonvolatile memory unit.

Figure 28:
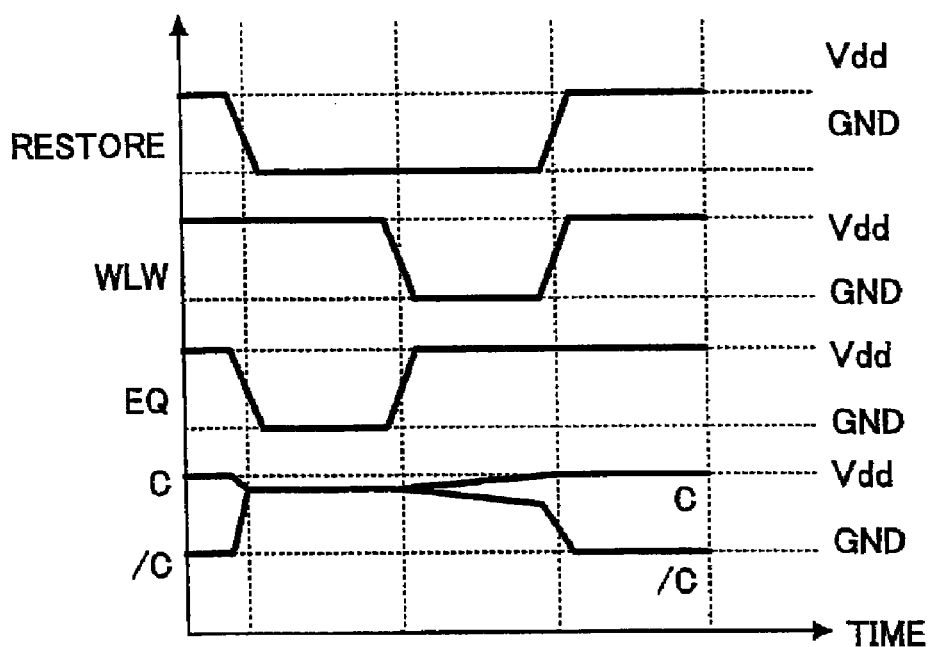
FIG. 28 is a signal waveform diagram for explaining the recall operation of the fourth embodiment of the nonvolatile memory device according to the present invention.

FIG. 28 is a signal waveform diagram for explaining the recall operation of the fourth embodiment of the nonvolatile memory device according to the present invention. When the mode input from the exterior of the device indicates a recall operation, the control signals RESTORE, RECALL, WLW, EQ, WL, and WE are set to 0-0-1, 1, 1-0-1, 0-1-1, 0, and 0, respectively, as shown in FIG. 26.

At the first phase 1P, the signal RESTORE is set to 0, and the signal EQ is set to 0. As a result, the NMOS transistor 81 in FIG. 25 becomes nonconductive to deactivate the volatile memory unit, and the PMOS transistor 86 in FIG. 25 becomes conductive to equalize the nodes C and /C. The equalization of the nodes C and /C is shown in FIG. 28 as occurring at the first phase 1P.

At the second phase 2P, the signal EQ is set to 1, and the word selecting line WLW is set to 0. As a result, the PMOS transistor 86 is turned off to separate the nodes C and /C from each other, and the PMOS transistors 84 and 85 are turned on. Assuming that the store operation as shown in FIG. 27 has been performed prior to the recall operation, the PMOS transistor 84 has a lower threshold voltage, and thus has a higher ON resistance. Accordingly, the force that pulls down the node C is weaker than the force that pulls down the node /C, resulting in the nodes C and /C changing to HIGH and LOW, respectively, as shown at the second phase 2P in FIG. 28.

The second phase may be set to a significantly shorter time length than the time length required for the store operation. Such provision makes it possible to suppress a change in the transistor characteristics through NBTI at the time of the recall operation. Alternatively or F additionally, the word selecting line WLW may be set to Vref rather than GND where Vref is an intermediate voltage between the power supply voltage Vdd and the ground voltage GND. Such provision reduces a voltage applied between the gate node and source/drain nodes of the PMOS transistors 84 and 85, thereby suppressing a change in the transistor characteristics through NBTI at the time of the recall operation.

At the third phase, the signal RESTORE is set to 1, and the word selecting line WLW is set to 1. As a result, the NMOS transistor 81 in FIG. 25 becomes conductive to activate the volatile memory unit, and the PMOS transistors 84 and 85 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 28.

Attention should be directed to the fact that the nodes C and /C after the recall operation are set to HIGH and LOW, respectively while the nodes C and /C as appearing in the original data are also HIGH and LOW, respectively. That is, the recalled data is the same as the original data, and no data inversion takes place through the store and recall operations. This is because the recall operation of the fourth embodiment detects data by pulling down the nodes C and /C according to the forces responsive to the ON resistances (threshold voltages). A transistor coupled to the higher of the nodes C and /C experiences NBTI so as to have a drop in the threshold voltage (i.e., an increase in the ON resistance). If the pull-down forces are used during the recall operation, the transistor that has experienced NBTI pulls down a corresponding node with a weaker force, which means that this node will be the higher of the two nodes.

Figure 29:
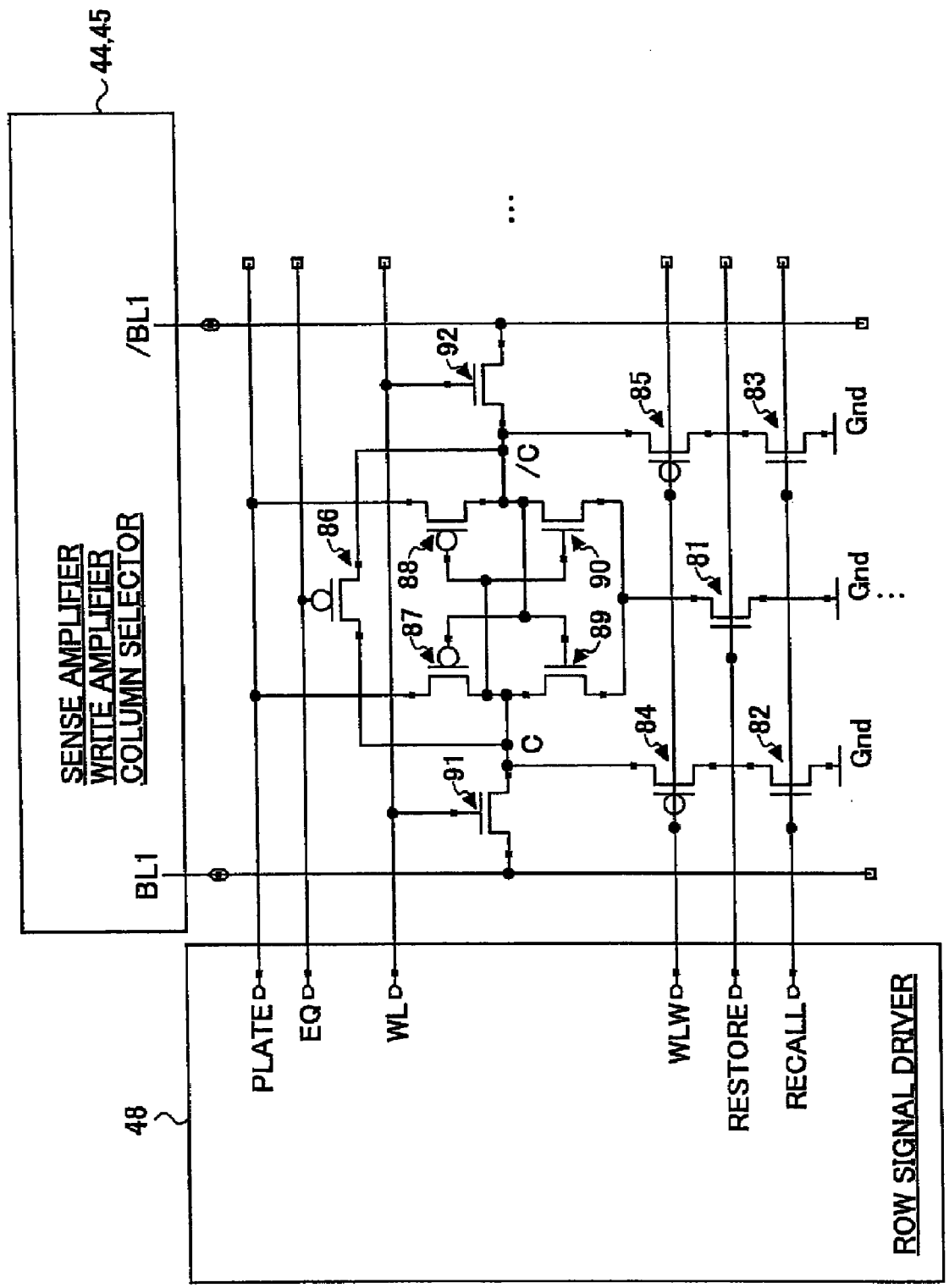
FIG. 29 is an illustrative drawing showing the configuration of a memory cell according to a fifth embodiment of the nonvolatile memory device of the present invention.

FIG. 29 is an illustrative drawing showing the configuration of a memory cell according to a fifth embodiment of the nonvolatile memory device of the present invention. The same elements as those of FIG. 25 are referred to by the same numerals, and a description thereof will be omitted unless necessary. In the configuration of FIG. 29, the source nodes of the PMOS transistors 87 and 88 are coupled to a plate line PLATE that extends from the row signal driver 48.

FIG. 30 is a table chart showing the signal levels of the control signals that are defined with respect to each operation. The columns of the table correspond to the respective control signals RESTORE, RECALL, WLW, EQ, WL, PLATE, and WE, which are generated by the mode selector 46 in response to the mode input signals supplied from an exterior of the device. The rows of the table correspond to respective operations "Write", "Read", "Store", "Recall", and "Standby". It should be noted that the plate line PLATE is set to the higher power supply potential Vpp during the store operation while it is set to the normal power supply potential Vdd during the other operations.

Figure 31:
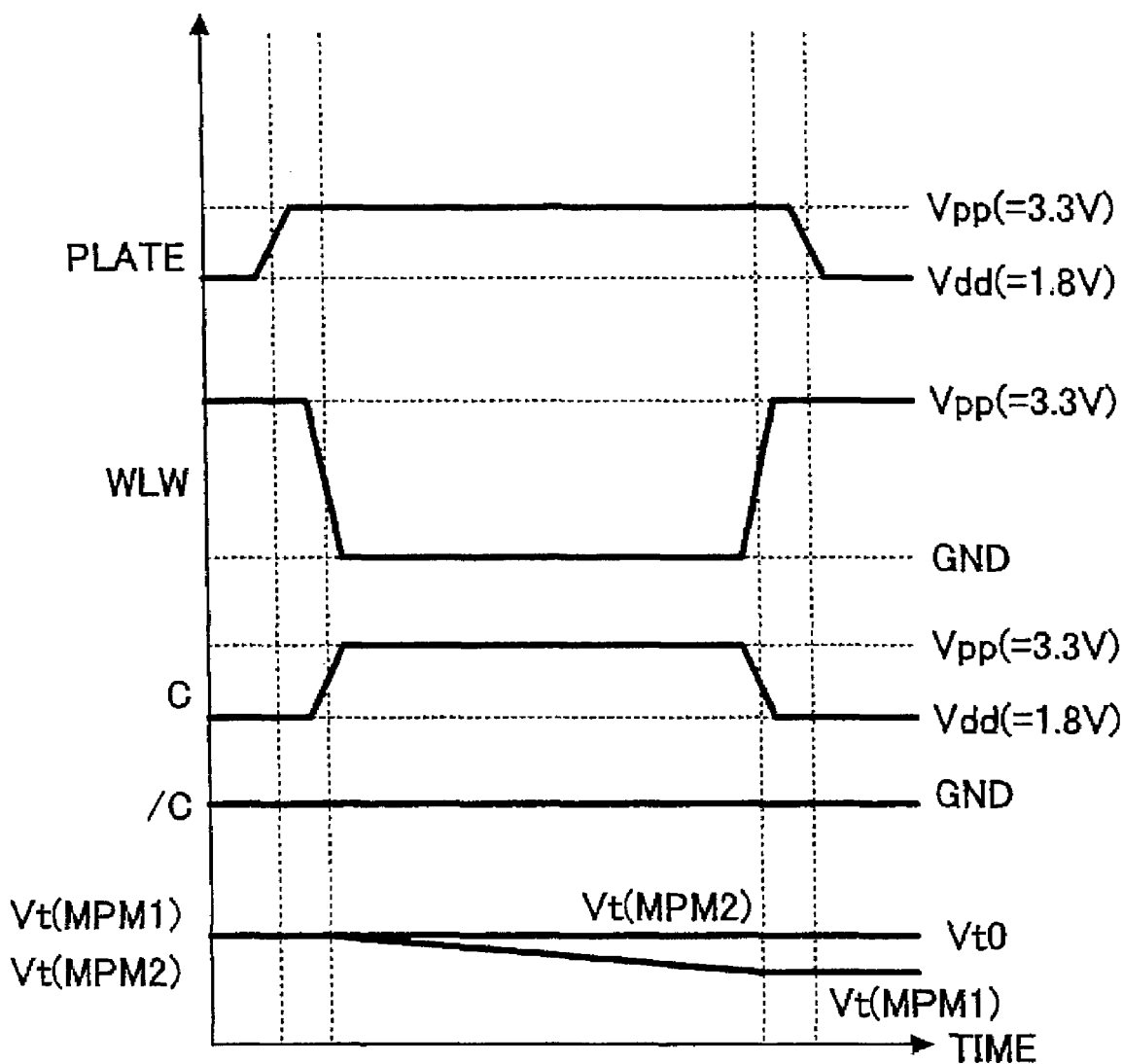
FIG. 31 is a signal waveform diagram for explaining the store operation of the nonvolatile memory device of the present invention.

FIG. 31 is a signal waveform diagram for explaining the store operation of the nonvolatile memory device of the present invention. When the mode input from the exterior of the device indicates a store operation, the control signals RESTORE, RECALL, WLW, EQ, WL, PLATE, and WE are set to 1, 0, 0, 1, 0, Vpp, and 0, respectively, as shown in FIG. 26. The setting of the word selecting line WLW to 0 (LOW) is shown in FIG. 31.

Since the signal RECALL is set to 0, the NMOS transistors 82 and 83 shown in FIG. 29 are made nonconductive. In the configuration of FIG. 29, thus, the PMOS transistor 84 has the drain node thereof coupled to a floating node and the source node thereof coupled to the node C of the volatile memory unit, and the PMOS transistor 85 has the drain node thereof coupled to a floating node and the source node thereof coupled to the node /C of the volatile memory unit.

Since the plate line signal PLATE is set to Vpp (e.g., 3.3 V), the volatile memory unit operates with the operating range from GND to Vpp. Thus, the higher of the node C and the node /C is set to Vpp. In an example shown in FIG. 31, the node C is set to Vpp=3.3 V, and the node /C is LOW (GND). As a result, only the PMOS transistor 84 (denoted as MPM1 in FIG. 31) experiences a drop in the threshold voltage Vt. The PMOS transistor 85 (denoted as MPM2 in FIG. 31) does not experience a change in the threshold voltage Vt. This achieves the storing of the data of the volatile memory unit in the nonvolatile memory unit.

For the recall operation, the plate line PLATE is set to Vdd as shown in FIG. 30. Accordingly, the recall operation of the fifth embodiment of the nonvolatile memory device is the same as the recall operation of the fourth embodiment.

In the fifth embodiment of the nonvolatile memory device, provision is made to control the power supply potential supplied to the memory cell. Specifically, the power supply potential is set to the higher power supply potential Vpp (e.g., 3.3 V) during the store operation while it is set to the normal (lower) power supply potential Vdd (e.g., 1.8 V) during the other operations. In this manner, the degradation of the transistors other than the PMOS transistors 84 and 85 can be avoided. Further, it should be noted that the transistor degradation occurs only during the store operation, and does not occur during the recall operation.

The embodiments described above have been directed to examples in which the NBTI degradation of PMOS transistors is used as a mechanism for data storage. As previously described, the present invention can as well be implemented by use of PBTI (Positive Bias Temperature Instability) degradation.

Figure 32:
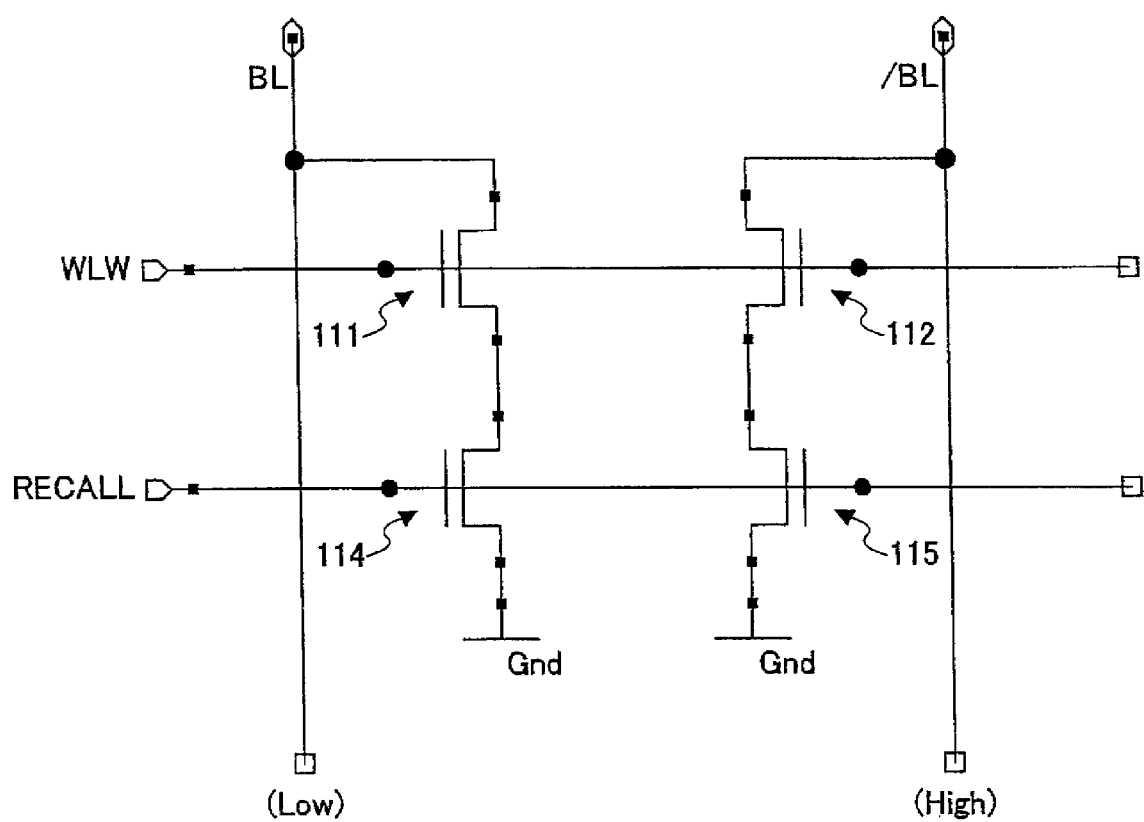
FIG. 32 is a circuit diagram showing an embodiment of a PBTI-based nonvolatile memory circuit according to the present invention.

FIG. 32 is a circuit diagram showing an embodiment of a PBTI-based nonvolatile memory circuit according to the present invention.

The memory circuit of FIG. 32 includes an NMOS transistor 111, an NMOS transistor 112, an NMOS transistor 114, an NMOS transistor 115, a word selecting line WLW, a recall line RECALL, and the bit lines BL and /BL. The NMOS transistor 111 has the gate node thereof coupled to the word selecting line WLW, the source node thereof coupled to the ground potential GND via the NMOS transistor 114, and the drain node thereof coupled to the bit line BL. The NMOS transistor 112 has the gate node thereof coupled to the word selecting line WLW, the source node thereof coupled to the ground potential GND via the NMOS transistor 115, and the drain node thereof coupled to the bit line /BL. The NMOS transistor 114 has the gate node thereof coupled to the recall line RECALL, the source node thereof coupled to the ground potential GND, and the drain node thereof coupled to the source node of the NMOS transistor 111. The NMOS transistor 115 has the gate node thereof coupled to the recall line RECALL, the source node thereof coupled to the ground potential GND, and the drain node thereof coupled to the source node of the NMOS transistor 112. This memory circuit is configured such that the potentials applied to the source nodes of the NMOS transistors 111 and 112 serving as data storage can be controlled independently of each other.

Figure 33:
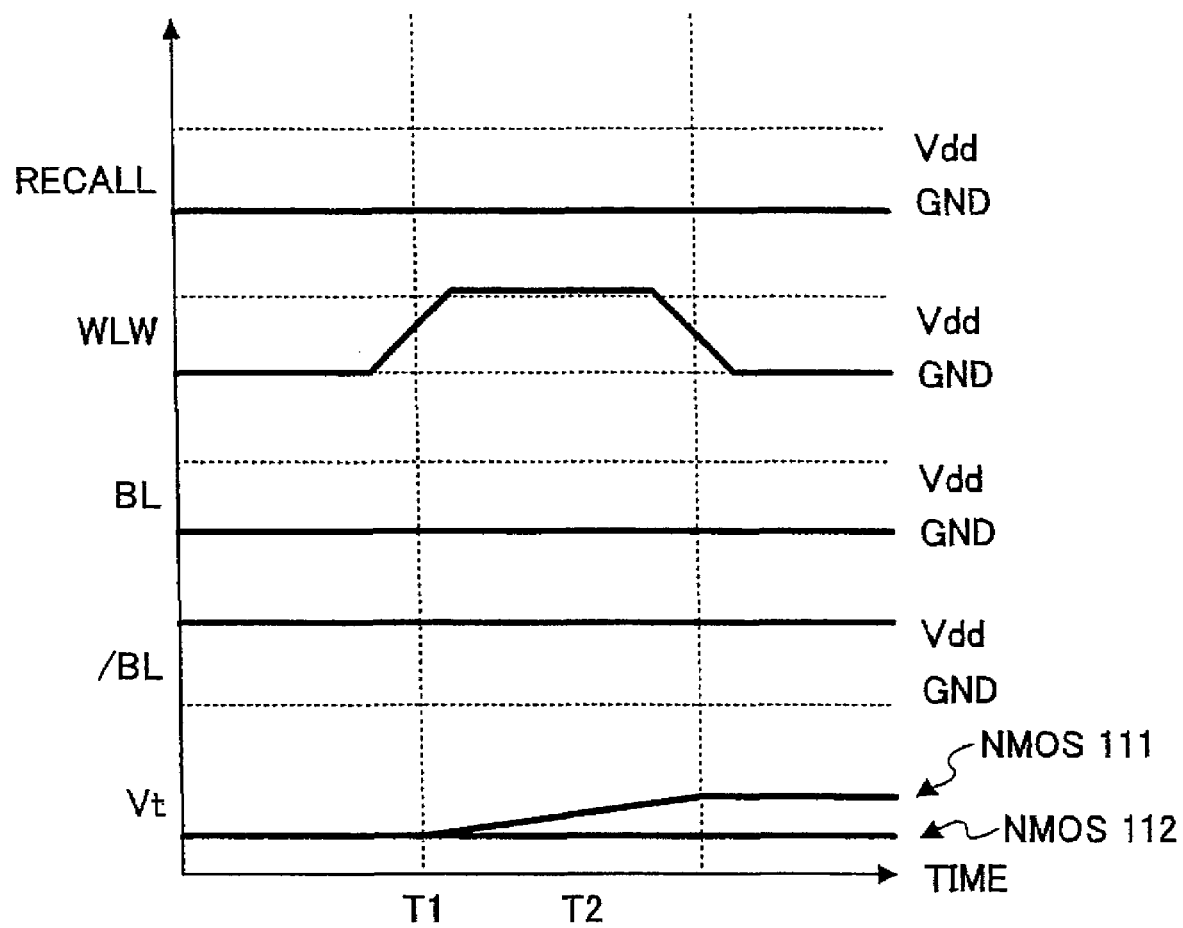
FIG. 33 is a drawing for explaining a write operation of the memory circuit shown in FIG. 32.

FIG. 33 is a drawing for explaining a write operation of the memory circuit shown in FIG. 32. In the memory circuit shown in FIG. 32, the bit line BL and the recall line RECALL are set to the ground potential GND, and the bit line /BL is set to the power supply potential Vdd, with the word selecting line WLW being set to the power supply potential Vdd, for example, as shown in FIG. 33. The setting of the recall line RECALL to the ground potential GND makes the NMOS transistors 114 and 115 nonconductive, thereby placing the source nodes of the NMOS transistors 111 and 112 in a floating state.

Since the gate node of the NMOS transistor 111 is set to the power supply potential Vdd, the floating source node of the NMOS transistor 111 is electrically coupled to the drain node that is set to the ground potential GND. As for the NMOS transistor 112, the gate node of the NMOS transistor 112 is set to the power supply potential Vdd, but the drain node thereof is also set to the power supply potential Vdd. As a result, only the NMOS transistor 111 degrades through PBTI while no current flows through either one of the transistors.

It should be noted that the recall line RECALL is used (set to the ground potential) when detecting a difference in carrier mobility between the NMOS transistor 111 and the NMOS transistor 112 as data stored in the nonvolatile memory circuit. Such detecting mechanism (sensing mechanism) will later be described.

Figure 34:
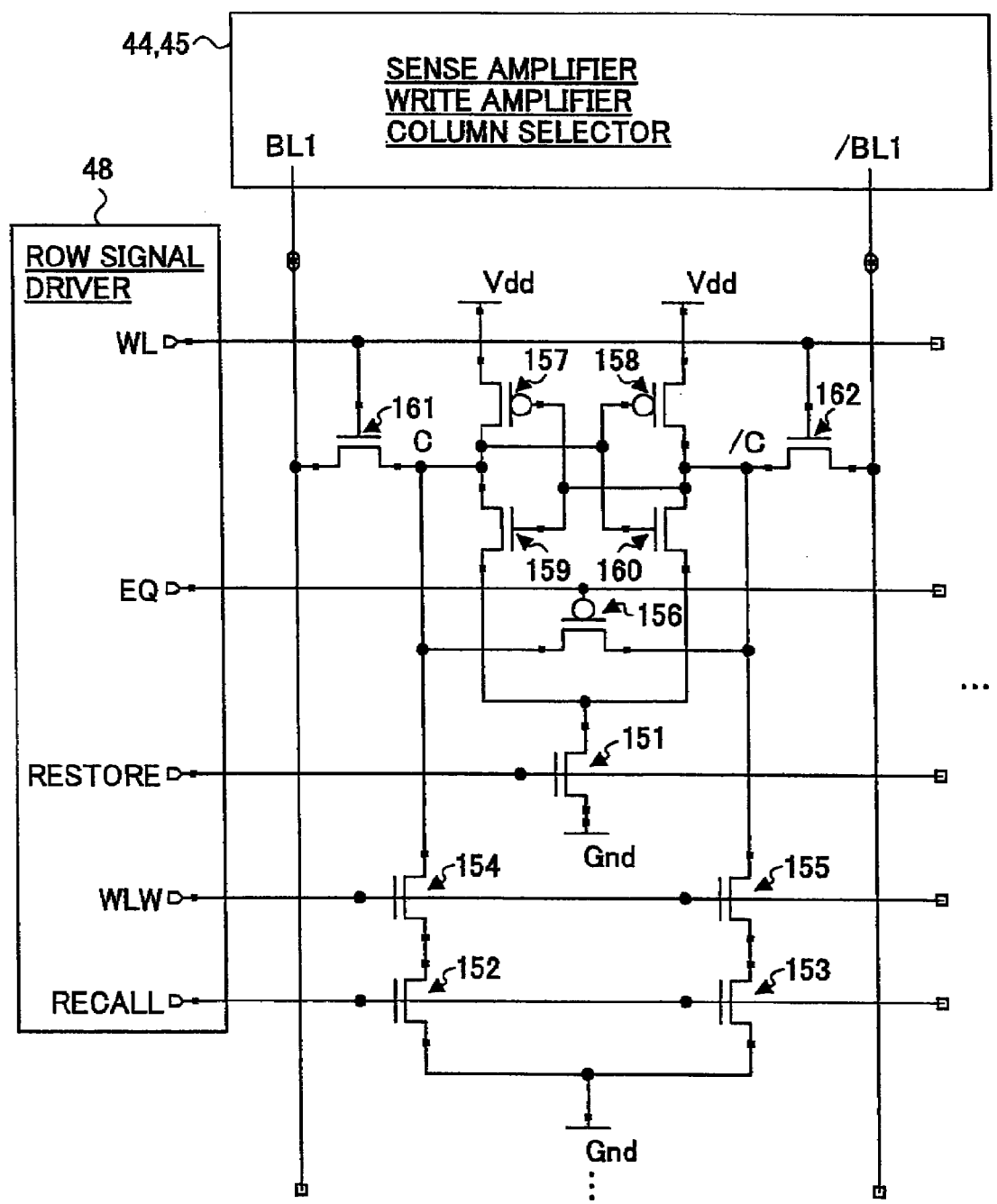
FIG. 34 is an illustrative drawing showing the configuration of a memory cell according to an embodiment of the PBTI-based nonvolatile memory device of the present invention.

FIG. 34 is an illustrative drawing showing the configuration of a memory cell according to an embodiment of the PBTI-based nonvolatile memory device of the present invention. The memory cell includes NMOS transistors 151 through 155, a PMOS transistor 156, PMOS transistors 157 and 158, and NMOS transistors 159 through 162.

It is preferable to manufacture the NMOS transistors 154 and 155 such that their gate oxide film is thinner than that of the other transistors. In this manner, the NMOS transistors 154 and 155 are designed to operate with a low operating voltage (e.g., 1.0 V to 1.8 V), and the other transistors are designed to operate with a higher operating voltage (e.g., 3.3 V).

As shown in FIG. 34, bit lines BL1 and /BL1 extend from the write amplifier 44 and the sense amplifier & column selector 45, and are coupled to the volatile memory unit via the NMOS transistors 161 and 162 serving as a data transfer unit. A word selecting line WLW extends from the row signal driver 48, and is coupled to the gate nodes of the NMOS transistors 154 and 155 serving as a nonvolatile memory unit. A word line WL extends from the row signal driver 48 to be connected to the gates of the NMOS transistors 161 and 162. Further, a restore line RESTORE, recall line RECALL, and equalize line EQ also extend from the row signal driver 48.

It should be noted that the configuration shown in FIG. 34 is identical with respect to each and every one of the memory cells provided in a memory cell array. Namely, multiple sets of the lines RESTORE, RECALL, WLW, EQ, and WL are provided in one-to-one correspondence to the rows of the memory cell array.

FIG. 35 is a table chart showing the signal levels of the control signals that are defined with respect to each operation. The columns of the table correspond to the respective control signals RESTORE, RECALL, WLW, EQ, WL, and WE, which are generated by the mode selector 46 in response to the mode input signals supplied from an exterior of the device. The rows of the table correspond to respective operations "Write", "Read", "Store", "Recall", and "Standby". "Write" refers to the operation that writes data to the volatile memory unit. "Read" refers to the operation that reads data from the volatile memory unit. "Store" refers to the operation that writes data from the volatile memory unit to the nonvolatile memory unit. "Recall" refers to the operation that reads data from the nonvolatile memory unit to the volatile memory unit. "Standby" refers to the state in which data is maintained in the volatile memory unit.

The mode selector 46 sets the control signals to signal levels (signal states) as shown in the table of FIG. 35 in response to the mode input signals. Through such settings of the control signals, the mode selector 46 controls the write amplifier 44 and the row signal driver 48 to perform a requested operation with respect to the memory cell array.

Figure 36:
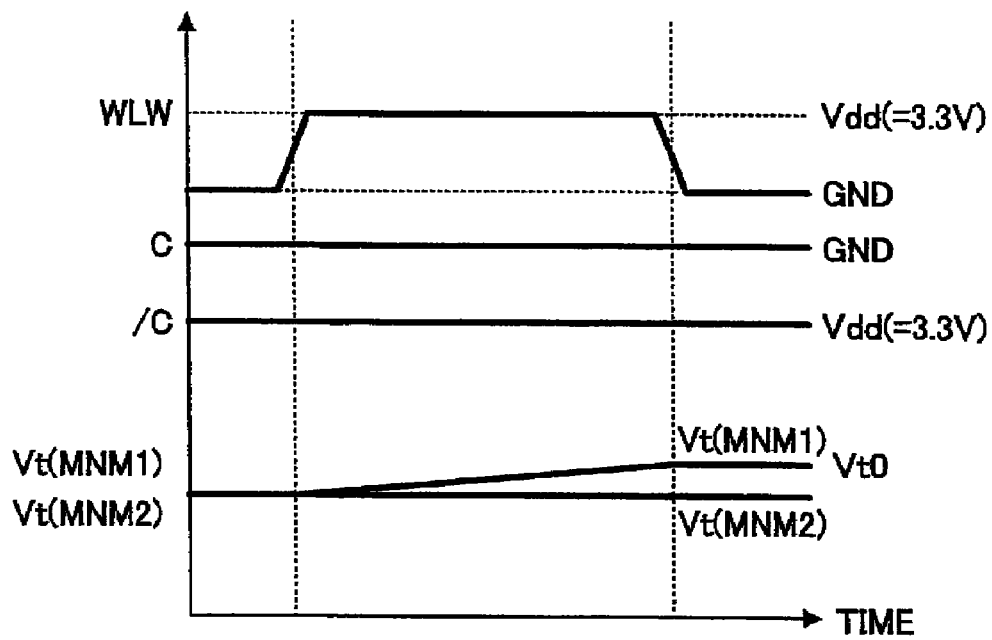
FIG. 36 is a signal waveform diagram for explaining the store operation of the nonvolatile memory device shown in FIG. 34.

FIG. 36 is a signal waveform diagram for explaining the store operation of the nonvolatile memory device shown in FIG. 34. When the mode input from the exterior of the device indicates a store operation, the control signals RESTORE, RECALL, WLW, EQ, WL, and WE are set to 1, 0, 1, 1, 0, and 0, respectively, as shown in FIG. 35. The setting of the word selecting line WLW to 1 (HIGH) is shown in FIG. 36.

Since the signal RECALL is set to 0, the NMOS transistors 152 and 153 shown in FIG. 34 are made nonconductive. In the configuration of FIG. 34, thus, the NMOS transistor 154 has the source node thereof coupled to a floating node and the drain node thereof coupled to a node C of the volatile memory unit, and the NMOS transistor 155 has the source node thereof coupled to a floating node and the drain node thereof coupled to a node /C of the volatile memory unit. Here, the potentials of the node C and the node /C are inverse to each other, and the data stored in the latch (PMOS transistors 157 and 158 and NMOS transistors 159 and 160) determines which one of the nodes C and /C is HIGH.

In an example shown in FIG. 36, the node /C is HIGH (Vdd=3.3 V), and the node C is LOW (GND). As a result, only the NMOS transistor 154 (denoted as MNM1 in FIG. 36) experiences a rise in the threshold voltage Vt. The NMOS transistor 155 (denoted as MNM2 in FIG. 36) does not experience a change in the threshold voltage Vt. This achieves the storing of the data of the volatile memory unit in the nonvolatile memory unit.

Figure 37:
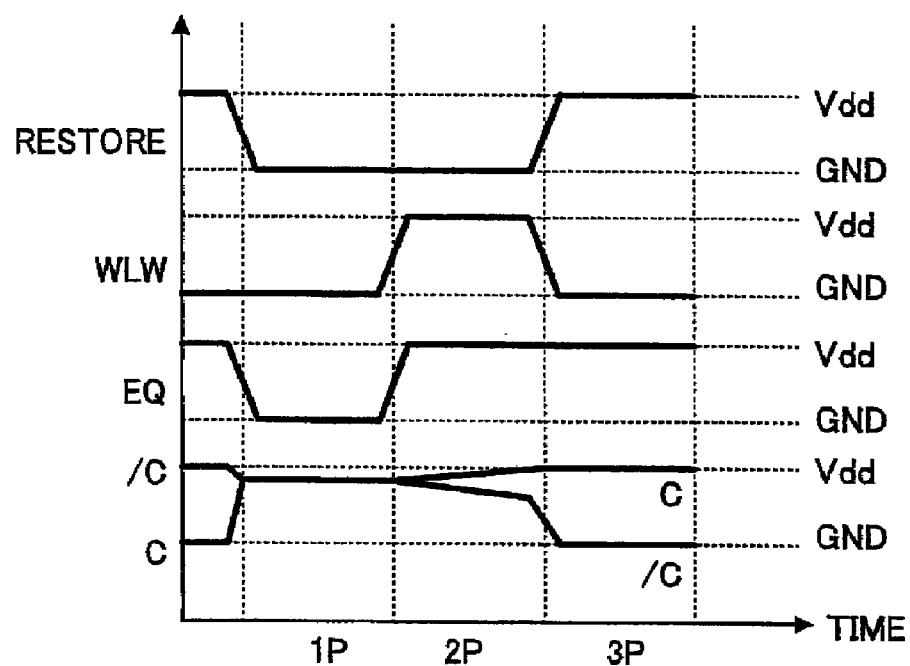
FIG. 37 is a signal waveform diagram for explaining the recall operation of the nonvolatile memory device shown in FIG. 34.

FIG. 37 is a signal waveform diagram for explaining the recall operation of the nonvolatile memory device shown in FIG. 34. When the mode input from the exterior of the device indicates a recall operation, the control signals RESTORE, RECALL, WLW, EQ, WL, and WE are set to 0-0-1, 1, 0-1-0, 0-1-1, 0, and 0, respectively, as shown in FIG. 35. Here, 0-0-1, for example, indicates that the signal level is set to 0 at the first phase, 0 at the second phase, and 1 at the third phase. The first, second, and third phases are shown in FIG. 37 as 1P, 2P, and 3P, respectively.

At the first phase 1P, the signal RESTORE is set to 0, and the signal EQ is set to 0. As a result, the NMOS transistor 151 in FIG. 34 becomes nonconductive to deactivate the volatile memory unit, and the PMOS transistor 156 in FIG. 34 becomes conductive to equalize the nodes C and /C. The equalization of the nodes C and /C is shown in FIG. 37 as occurring at the first phase 1P.

At the second phase 2P, the signal EQ is set to 1, and the word selecting line WLW is set to 1. As a result, the PMOS transistor 156 is turned off to separate the nodes C and /C from each other, and the NMOS transistors 154 and 155 are turned on. Assuming that the store operation as shown in FIG. 36 has been performed prior to the recall operation, the NMOS transistor 154 has a higher threshold voltage, and thus has a higher ON resistance. Accordingly, the force that pulls down the node C is weaker than the force that pulls down the node /C, resulting in the nodes C and /C changing to HIGH and LOW, respectively, as shown at the second phase 2P in FIG. 37.

The second phase may be set to a significantly shorter time length than the time length required for the store operation. Such provision makes it possible to suppress a change in the transistor characteristics through PBTI at the time of the recall operation.

At the third phase, the signal RESTORE is set to 1, and the word selecting line WLW is set to 0. As a result, the NMOS transistor 151 in FIG. 34 becomes conductive to activate the volatile memory unit, and the NMOS transistors 154 and 155 are turned off. The activated volatile memory unit amplifies a potential difference appearing between the node C and the node /C, thereby sensing (detecting) the data stored in the nonvolatile memory unit. The amplification of the potential difference between the nodes C and /C is shown at the third phase 3P in FIG. 37.

The PBTI-based configuration of FIG. 34 corresponds to the NBTI-based configuration shown in FIG. 11. Specifically, the NBTI-based configuration shown in FIG. 11 is modified to the PBTI-based configuration shown in FIG. 34 by replacing the PMOS transistors with NMOS transistors. It should be noted that other NBTI-based configurations such as those shown in FIG. 17, FIG. 21, FIG. 25, and FIG. 29 can also be modified to PBTI-based configurations similarly to the manner described above by replacing the PMOS transistors with NMOS transistors. Such PBTI-based configurations are intended to be within the scope of the present invention.

Further, the present invention is not limited to these embodiments, but various variations and modifications may be made without departing from the scope of the present invention.

The invention claimed is:

1. A nonvolatile memory device, comprising:
a pair of PMOS transistors; and
a control circuit configured to operate in a store mode to apply to a first one of the PMOS transistors potentials that cause an NBTI degradation purposefully and to apply to a second one of the PMOS transistors potentials that cause no NBTI degradation while causing no current to flow between a source node and a drain node of said first one of the PMOS transistors, and to operate in a recall mode to set gate nodes of the PMOS transistors to a common potential to detect a difference in the NBTI degradation between said PMOS transistors,
wherein the gate node of said first one of the PMOS transistors is coupled to the drain node of said second one of the PMOS transistors, and the gate node of said second one of the PMOS transistors is coupled to the drain node of said first one of the PMOS transistors.

2. The nonvolatile memory device as claimed in claim 1, wherein said control circuit is configured to operate in the store mode to apply a first potential to the source node and the drain node of said first one of the PMOS transistors and to apply a second potential to the gate node of said first one of the PMOS transistors, said first potential being higher than the second potential.

3. The nonvolatile memory device as claimed in claim 1, wherein a difference between the first potential and the second potential exceeds a maximum potential difference that is applied between the gate node and source node of the PMOS transistors during the recall mode.

4. A nonvolatile memory device, comprising:
a pair of NMOS transistors; and
a control circuit configured to operate in a store mode to apply to a first one of the NMOS transistors potentials that cause an PBTI degradation purposefully and to apply to a second one of the NMOS transistors potentials that cause no PBTI degradation while causing substantially no current to flow between a source node and a drain node of said first one of the NMOS transistors, and to operate in a recall mode to set gate nodes of the NMOS transistors to a common potential to detect a difference in the PBTI degradation between said NMOS transistors,
wherein the gate node of said first one of the NMOS transistors is coupled to the drain node of said second one of the NMOS transistors, and the gate node of said second one of the NMOS transistors is coupled to the drain node of said first one of the NMOS transistors.

5. The nonvolatile memory device as claimed in claim 4, wherein said control circuit is configured to operate in the store mode to apply a first potential to the source node and the drain node of said first one of the NMOS transistors and to apply a second potential to the gate node of said first one of the NMOS transistors, said first potential being lower than the second potential.

6. The nonvolatile memory device as claimed in claim 4, wherein a difference between the first potential and the second potential exceeds a maximum potential difference that is applied between the gate node and source node of the NMOS transistors during the recall mode.

7. A nonvolatile memory device, comprising:
a plurality of word lines;
a plurality of bit line pairs;
a memory cell array including a plurality of memory cells arranged in a matrix, one of said memory cells coupled to one of said bit line pairs that includes a first bit line and a second bit line, said one of said memory cells including:
a latch having a first node and a second node configured such that a potential of the first node is inverse to a potential of the second node;
a first PMOS transistor having one of source/drain nodes thereof coupled to the first node of said latch;
a second PMOS transistor having one of source/drain nodes thereof coupled to the second node of said latch;
a third transistor having a gate thereof coupled to one of said word lines and source/drain nodes thereof coupled to the first node and the first bit line, respectively;
a fourth transistor having a gate thereof coupled to said one of said word lines and source/drain nodes thereof coupled to the second node and the second bit line, respectively; and
a control circuit configured to operate in a store mode to apply to, the first PMOS transistor, potentials that cause an NBTI degradation purposefully, and to apply to, the second PMOS transistor, potentials that cause no NBTI degradation while causing no current to flow between the source/drain nodes of the first PMOS transistor, and to operate in a recall mode to set gate nodes of the first and second PMOS transistors to a common potential such as to cause said latch to detect a difference in the NBTI degradation between said first PMOS transistor and said second PMOS transistor,
wherein the gate node of said first PMOS transistor is coupled to said second node of the latch, and the gate node of said second PMOS transistor is coupled to said first node of the latch.

8. The nonvolatile memory device as claimed in claim 7, wherein said control circuit is configured to operate in the store mode to apply a first potential to one of the source/drain nodes of said first PMOS transistor on an opposite side to the first node of the latch, and to apply the first potential to one of the source/drain nodes of said second PMOS transistor on an opposite side to the second node of the latch, said second node of the latch being at a second potential, and said first potential higher than the second potential.

9. The nonvolatile memory device as claimed in claim 8, wherein a difference between the first potential and the second potential exceeds a maximum potential difference that is applied between the gate node and the source/drain nodes of the first and second PMOS transistors during the recall mode.

10. The nonvolatile memory device as claimed in claim 7, further comprising:
a MOS transistor between the first node and the first PMOS transistor to place a limit to a potential of the first node of the latch; and
a MOS transistor between the second node and the second PMOS transistor to place a limit to a potential of the second node of the latch,
wherein the first PMOS transistor and the second PMOS transistor operate with a higher power supply potential than the latch.

11. The nonvolatile memory device as claimed in claim 7, wherein said first PMOS transistor and said second PMOS transistor are configured to pull up the first node of the latch and the second node of the latch, respectively, in the recall mode.

12. A nonvolatile memory device, comprising:
a plurality of word lines;
a plurality of bit line pairs;
a memory cell array including a plurality of memory cells arranged in a matrix, one of said memory cells coupled to one of said bit line pairs that includes a first bit line and a second bit line, said one of said memory cells including:
- a latch having a first node and a second node configured such that a potential of the first node is inverse to a potential of the second node;
- a first NMOS transistor having one of source/drain nodes thereof coupled to the first node of said latch;
- a second NMOS transistor having one of source/drain nodes thereof coupled to the second node of said latch;
- a third transistor having a gate thereof coupled to one of said word lines and source/drain nodes thereof coupled to the first node and the first bit line, respectively;
- a fourth transistor having a gate thereof coupled to said one of said word lines and source/drain nodes thereof coupled to the second node and the second bit line, respectively; and
- a control circuit configured to operate in a store mode to apply to, the first NMOS transistor, potentials that cause a PBTI degradation purposefully, and to apply to, the second NMOS transistor, potentials that cause no PBTI degradation while causing no current to flow between the source/drain nodes of the first NMOS transistor, and to operate in a recall mode to set gate nodes of the first and second NMOS transistors to a common potential such as to cause said latch to detect a difference in the PBTI degradation between said first NMOS transistor and said second NMOS transistor, wherein the gate node of said first NMOS transistor is coupled to said second node of the latch, and the gate node of said second NMOS transistor is coupled to said first node of the latch, said first node of the latch being at the first potential.

13. The nonvolatile memory device as claimed in claim 12, wherein said control circuit is configured to operate in the store mode to apply a first potential to one of the source/drain nodes of said first NMOS transistor on an opposite side to the first node of the latch, and to apply the first potential to one of the source/drain nodes of said second NMOS transistor on an opposite side to the second node of the latch, said second node of the latch being at a second potential, and said first potential higher than the second potential.

14. The nonvolatile memory device as claimed in claim 13, wherein a difference between the first potential and the second potential exceeds a maximum potential difference that is applied between the gate node and the source/drain nodes of the first and second NMOS transistors during the recall mode.

15. The nonvolatile memory device as claimed in claim 12, further comprising:
- a MOS transistor between the first node and the first NMOS transistor to place a limit to a potential of the first node of the latch; and
- a MOS transistor between the second node and the second NMOS transistor to place a limit to a potential of the second node of the latch,
- wherein the first NMOS transistor and the second NMOS transistor operate with a higher power supply potential than the latch.

16. The nonvolatile memory device as claimed in claim 12, wherein said first NMOS transistor and said second NMOS transistor are configured to pull down the first node of the latch and the second node of the latch, respectively, in the recall mode.

17. The nonvolatile memory device as claimed in claim 16, wherein said control circuit is configured to control a power supply potential provided to said latch.

* * * * *